United States Patent
Iida et al.

(10) Patent No.: US 9,201,105 B2
(45) Date of Patent: Dec. 1, 2015

(54) SENSOR UNIT, INPUT DEVICE, AND ELECTRONIC APPARATUS

(71) Applicant: Sony Corporation, Tokyo (JP)

(72) Inventors: Fumihiko Iida, Kanagawa (JP); Hiroto Kawaguchi, Kanagawa (KR); Hayato Hasegawa, Kanagawa (JP); Takashi Itaya, Kanagawa (JP); Toshio Kano, Kanagawa (JP); Takayuki Tanaka, Kanagawa (JP); Kei Tsukamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 378 days.

(21) Appl. No.: 13/787,309

(22) Filed: Mar. 6, 2013

(65) Prior Publication Data

US 2013/0234734 A1    Sep. 12, 2013

(30) Foreign Application Priority Data

Mar. 9, 2012    (JP) .................................. 2012-052821
Jun. 27, 2012    (JP) .................................. 2012-144470
Jan. 25, 2013    (WO) .................. PCT/JP2013/000380

(51) Int. Cl.
*G01R 27/26*    (2006.01)
*G06F 3/044*    (2006.01)
*G01L 1/14*    (2006.01)
*G06F 3/041*    (2006.01)

(52) U.S. Cl.
CPC ............ *G01R 27/2605* (2013.01); *G01L 1/146* (2013.01); *G06F 3/044* (2013.01); *G06F 3/0414* (2013.01); *G06F 2203/04102* (2013.01); *G06F 2203/04103* (2013.01)

(58) Field of Classification Search
CPC ...... G01R 27/26; G01R 27/2605; G01D 5/24; G01D 5/2417; G06F 3/0414; G06F 3/044; G06F 2203/04103; G01L 1/146
USPC ................. 324/661, 658, 649, 600, 686, 519, 324/750.17
See application file for complete search history.

(56) References Cited

U.S. PATENT DOCUMENTS

| | | | |
|---|---|---|---|
| 6,820,494 B2 * | 11/2004 | Morimoto ........................ | 73/780 |
| 7,174,793 B2 * | 2/2007 | Morimoto ................. | 73/862.045 |
| 2008/0202251 A1 * | 8/2008 | Serban et al. .................... | 73/780 |

(Continued)

FOREIGN PATENT DOCUMENTS

| JP | 2011-170659 | 9/2011 |
|---|---|---|
| JP | 2011-180739 | 9/2011 |

OTHER PUBLICATIONS

Patent Cooperation Treaty, International Search Report issued in connection with International application No. PCT/JP2013/000380, mailed on Apr. 23, 2013. (5 pages).

*Primary Examiner* — Hoai-An D Nguyen
(74) *Attorney, Agent, or Firm* — K&L Gates LLP

(57) ABSTRACT

A sensor unit is provided and includes a first substrate, first and second electrodes, an input portion disposed so that a gap exists between the substrate and the input portion, a plurality of first structures disposed in the gap and extending at least partially between the first substrate and the input portion, and a second insulating structure disposed on a side of the first structures that is away from the input portion, or between adjacent first structures. The sensor unit is configured to detect a change in capacitance between the first and second electrodes upon a change in position of the input portion relative to the first substrate.

25 Claims, 31 Drawing Sheets

(56) References Cited

U.S. PATENT DOCUMENTS

2010/0102830 A1* 4/2010 Curtis et al. .................. 324/661
2011/0069030 A1* 3/2011 Nozawa ........................ 345/173
2013/0264179 A1* 10/2013 Ryonai et al. ................. 200/269

* cited by examiner

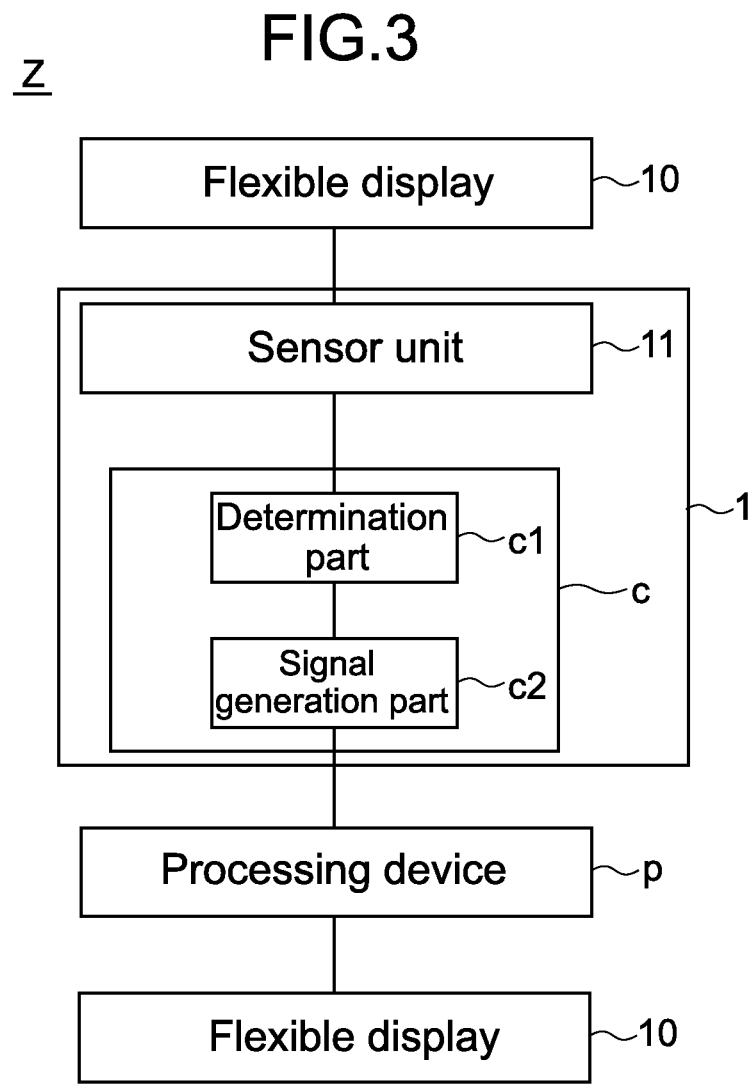

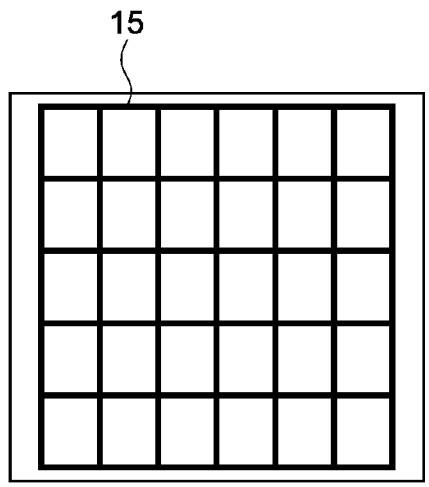
FIG.11A
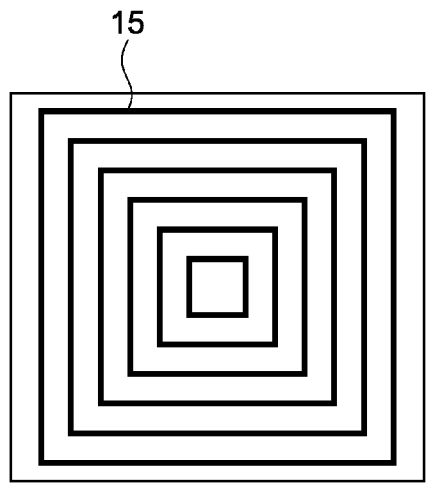
FIG.11B
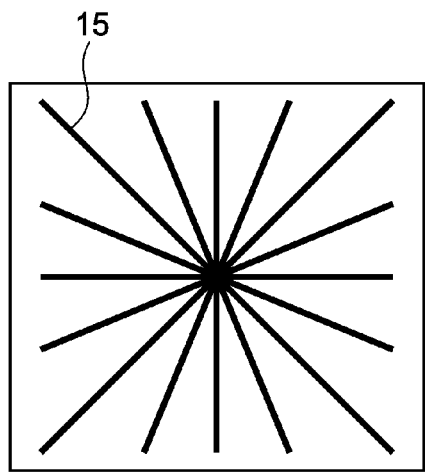
FIG.11C
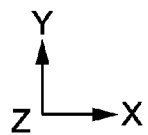

FIG.20
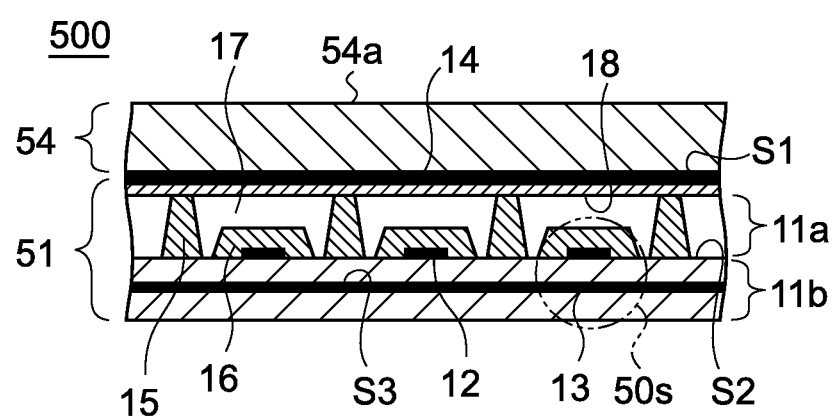
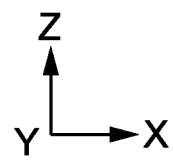

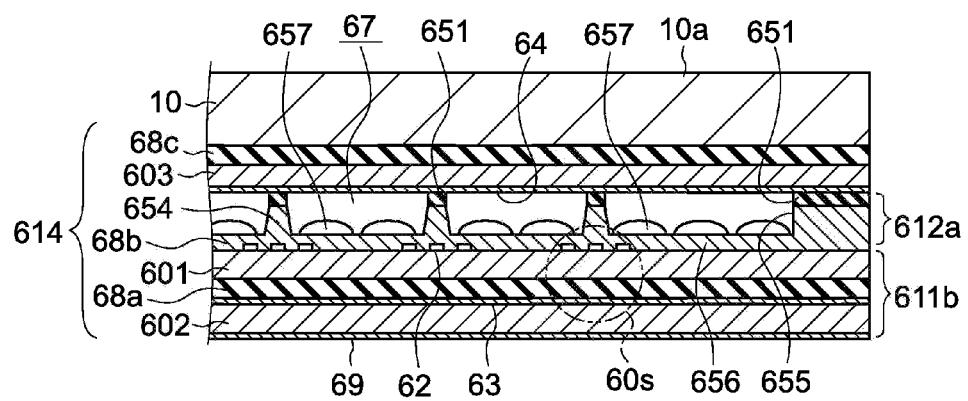
FIG. 34
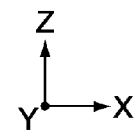
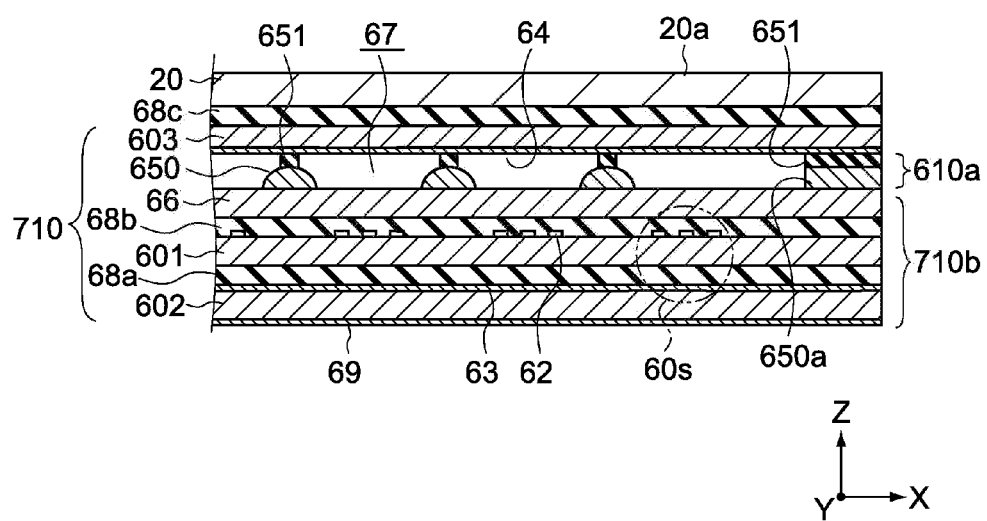
FIG. 35
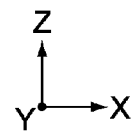

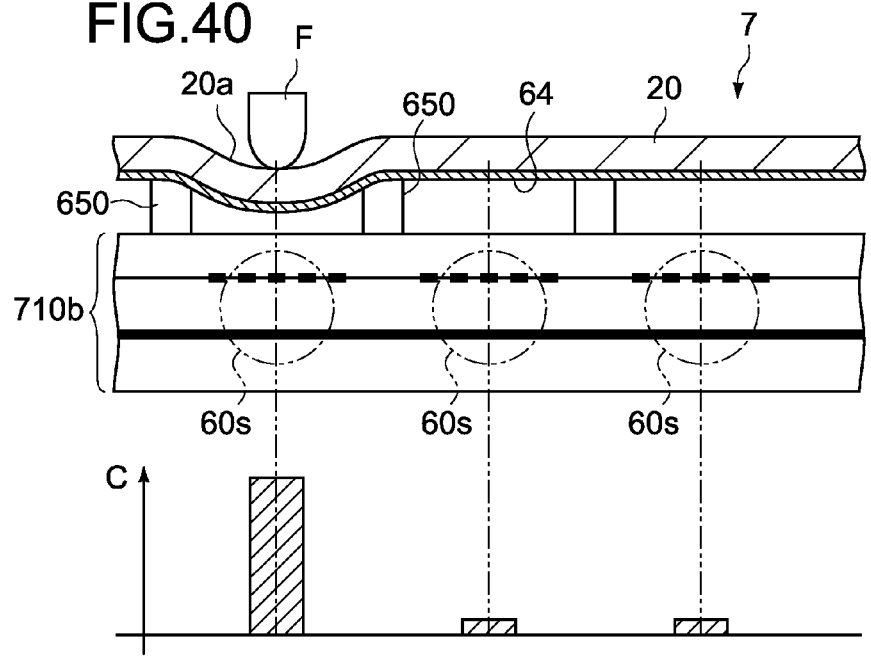
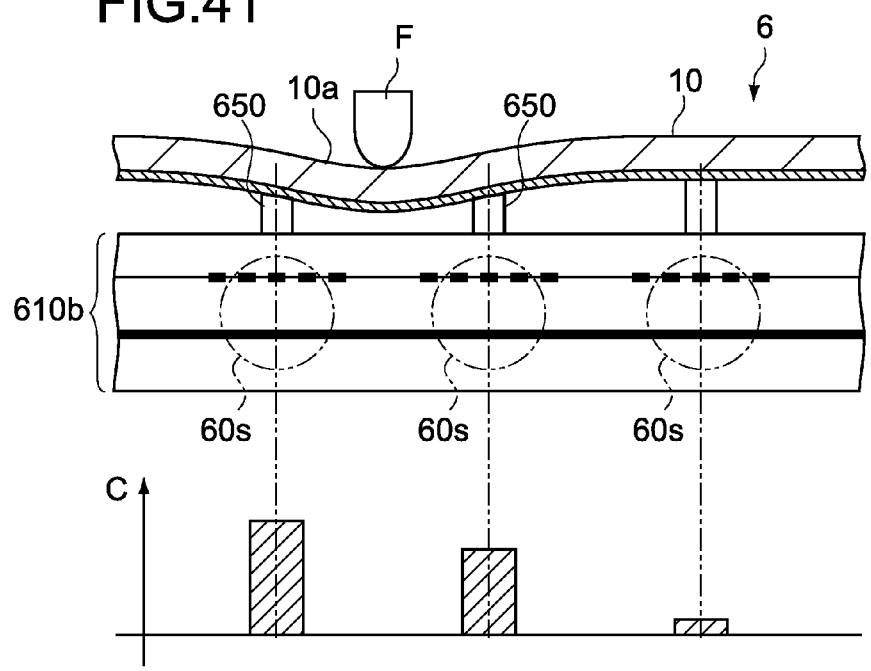

SENSOR UNIT, INPUT DEVICE, AND ELECTRONIC APPARATUS

CROSS REFERENCES TO RELATED APPLICATIONS

The present application claims priority to Japanese Priority Patent Application JP 2012-052821 filed in the Japan Patent Office on Mar. 9, 2012, JP 2012-144470 filed in the Japan Patent Office on Jun. 27, 2012, and International Patent Application No. PCT/JP2013/000380 filed on Jan. 25, 2013, the entire content of which is hereby incorporated by reference.

BACKGROUND

The present disclosure relates to a sensor unit having capacitive elements, an input device, and an electronic apparatus.

A known input device for use in an electronic apparatus includes capacitive elements. For example, Japanese Patent Application Laid-open No. 2011-170659 discloses an input device capable of detecting an operation by an operation element based on a change in the capacitance of capacitive elements.

SUMMARY

The input device described in Japanese Patent Application Laid-open No. 2011-170659 detects a pressure force caused by the operation of the operation element. Accordingly, if an input device is capable of detecting a smaller pressure force than a known input device such as the one described in Japanese Patent Application Laid-open No. 2011-170659, it is applicable to new fields.

The present disclosure has been made in view of the above circumstances, and it is therefore desirable to provide a sensor unit, an input device, and an electronic apparatus capable of detecting a smaller pressure force.

According to an embodiment, a sensor unit is provided and includes a first substrate, first and second electrodes, an input portion disposed so that a gap exists between the substrate and the input portion, a plurality of first structures disposed in the gap and extending at least partially between the first substrate and the input portion, and a second insulating structure disposed on a side of the first structures that is away from the input portion, or between adjacent first structures. The sensor unit is configured to detect a change in capacitance between the first and second electrodes upon a change in position of the input portion relative to the first substrate.

According to another embodiment, a method of detecting a change in capacitance in a sensor unit is provided. The sensor unit includes a first substrate, first and second electrodes, an input portion disposed so that a gap exists between the substrate and the input portion, and a plurality of first structures disposed in the gap and extending at least partially between the first substrate and the input portion, and a second insulating structure disposed on a side of the first structures that is away from the input portion, or between adjacent first structures. The method includes changing a position of the input portion relative to the first substrate, and detecting a change in capacitance between the first and second electrodes based upon the change in position of the input portion relative to the first substrate.

According to another embodiment, an electronic device is provided and includes a sensor unit including a first substrate, first and second electrodes, an input portion disposed so that a gap exists between the substrate and the input portion, a plurality of first structures disposed in the gap and extending at least partially between the first substrate and the input portion, and a second insulating structure disposed on a side of the first structures that is away from the input portion, or between adjacent first structures. The electronic device further includes a controller including a detection part configured to detect a change in the capacitance between the first and second electrodes upon a change in position of the input portion relative to the first substrate, and a signal generation part configured to generate an operation signal based on a detection result of the detection part.

According to an embodiment of the present disclosure, there is provided a sensor unit including a first surface, a second surface, a support layer, and capacitive elements.

The first surface and the second surface face each other.

The support layer has first structures and spaces. The first structures are each partially arranged between the first surface and the second surface and each have a first height. The spaces are each formed between the first surface and the second surface.

The capacitive elements each have a first electrode and a second electrode and are each configured to cause a change in capacitance between the first electrode and the second electrode depending on a change in a distance between the first surface and the second surface facing each other via corresponding one of the spaces. The first electrode is arranged on one of the first surface and the second surface. The second electrode is arranged facing the first electrode.

With this configuration, the sensor unit can detect a smaller pressure force with the capacitive elements.

The support layer may further have second structures each arranged in corresponding one of the spaces and each having a second height lower than the first height.

With this configuration, the sensor unit can detect a smaller pressure force with the capacitive elements according to the operation of the second structures.

The second structures may be formed on at least one of the first surface and the second surface.

With this configuration, the sensor unit can detect a smaller pressure force with the capacitive elements according to the operation of the second structures.

The sensor unit may further have a third surface arranged on a side opposite to the first surface with respect to the second surface and facing the second surface and have a reference electrode formed on the first surface. In this case, the first electrodes are formed on the second surface, and the second electrodes are formed on the third surface arranged on the side opposite to the first surface with respect to the second surface and facing the second surface.

With this configuration, the sensor unit can detect a smaller pressure force in a mutual-capacitance system.

In the sensor unit, the first electrodes may be formed on the first surface, and the second electrodes may be formed on the second surface.

With this configuration, the sensor unit can detect a smaller pressure force in a self-capacitance system.

In the sensor unit, the first electrodes and the second electrodes may be formed on the first surface.

With this configuration, the sensor unit can detect a smaller pressure force in a self-capacitance system.

The sensor unit may further include a reference electrode formed on the first surface, and the first electrodes and the second electrodes may be formed on the second surface.

With this configuration, the sensor unit can detect a smaller pressure force in a mutual-capacitance system.

In the sensor unit, the first structures may include a plurality of column-shaped bodies, and the plurality of column-shaped bodies may be arranged regularly.

With this configuration, the support layer can apply a uniform elastic force onto the first surface in the sensor unit.

The plurality of column-shaped bodies may be each formed into a shape whose cross section parallel to the first surface is one of a circle and a polygon.

With this configuration, the support layer can apply a uniform elastic force onto the first surface in the sensor unit.

According to another embodiment of the present disclosure, there is provided a sensor unit including a substrate, a conductive layer, and a support layer.

The substrate includes a plurality of first electrodes and a plurality of second electrodes facing the plurality of first electrodes.

The conductive layer faces the plurality of first electrodes and has flexibility.

The support layer includes a plurality of structures that are arranged between the substrate and the conductive layer and support the conductive layer, and a space formed between the plurality of structures and capable of partially changing a distance between the substrate and the conductive layer.

The substrate may further include an insulating layer provided between the plurality of first electrodes and the support layer.

The plurality of structures may be arranged in at least a part of intersection areas of the plurality of first electrodes and the plurality of second electrodes. In this case, the plurality of structures may be formed of an elastic material.

The plurality of structures may be arranged in an area other than intersection areas of the plurality of first electrodes and the plurality of second electrodes. Alternatively, the substrate may further include a base material that supports the plurality of first electrodes.

The support layer may further include a bonding part disposed between the plurality of structures and the conductive layer and configured to bond the plurality of structures to the conductive layer. Alternatively, the plurality of structures may be formed of a bonding material that bonds the substrate and the conductive layer to each other.

The support layer may further include a base part and a regulation part. The base part is configured to support the plurality of structures and faces the conductive layer with the space intervened therebetween. The regulation part is disposed on the base part and configured to prevent the conductive layer from being in contact with the base part.

According to another embodiment of the present disclosure, there is provided an input device including one or more sensors and a controller.

The one or more sensors each have a first surface, a second surface, a support layer, and capacitive elements.

The first surface and the second surface face each other.

The support layer has first structures and spaces. The first structures are each partially arranged between the first surface and the second surface and each have a first height. The spaces are each formed between the first surface and the second surface.

The capacitive elements each have a first electrode and a second electrode and are each configured to cause a change in capacitance between the first electrode and the second electrode depending on a change in a distance between the first surface and the second surface facing each other via corresponding one of the spaces. The first electrode is arranged on one of the first surface and the second surface. The second electrode is arranged facing the first electrode.

The controller has a detection part configured to detect the change in the capacitance and a signal generation part configured to generate an operation signal based on a detection result of the detection part.

With this configuration, the input device can detect a smaller pressure force with the capacitive elements.

The sensors may include a plurality of sensors. In this case, the detection part is configured to determine, based on a change in the capacitance of the capacitive elements, a first state where an operation element is in contact with any of the plurality of sensors and a change from the first state to a second state where the operation element presses the sensor. Thus, the detection part can discriminate between a touch operation and a press operation on the sensors depending on whether a change amount of the capacitance exceeds a predetermined threshold, for example.

The plurality of sensors may each further have a third surface arranged on a side opposite to the first surface with respect to the second surface and facing the second surface and have a reference electrode formed on the first surface. In this case, the first electrodes may be formed on the second surface, and the second electrodes may be formed on the third surface. With this configuration, each of the sensors can detect a smaller pressure force in a mutual-capacitance system.

The first electrodes may include aggregates of linear electrodes, and the second electrodes may include planar electrodes. Thus, because the facing areas between the first electrodes and the second electrodes become small, both of the first electrodes and the second electrodes can be capacitively coupled to the reference electrode.

The first electrodes may include a plurality of first wiring electrodes arranged in a first axis direction. In this case, the second electrodes include a plurality of second wiring electrodes arranged in a second axis direction intersecting the first axis direction, and the plurality of sensors each include a plurality of intersection parts where the first wiring electrodes and the second wiring electrodes intersect each other. Thus, the detection sensitivity and the output characteristics with an excellent linearity of the individual sensors can be secured.

The plurality of intersection parts may be formed with different density for each area. Thus, desired output characteristics can be obtained.

The plurality of sensors may include a plurality of sensors each having different sensitivity for detecting the capacitance of the capacitive element.

According to still another embodiment of the present disclosure, there is provided an electronic apparatus including one or more sensors, a controller, and an input operation part.

The one or more sensors each have a first surface, a second surface, a support layer, and capacitive elements.

The first surface and the second surface face each other.

The support layer has first structures and spaces. The first structures are each partially arranged between the first surface and the second surface and each have a first height. The spaces are each formed between the first surface and the second surface.

The capacitive elements each have a first electrode and a second electrode and are each configured to cause a change in capacitance between the first electrode and the second electrode depending on a change in a distance between the first surface and the second surface facing each other via corresponding one of the spaces. The first electrode is arranged on one of the first surface and the second surface. The second electrode is arranged facing the first electrode.

The controller has a detection part configured to detect the change in the capacitance and a signal generation part configured to generate an operation signal based on a detection result of the detection part.

The input operation part is arranged on a side of the first surface of the capacitive elements.

With this configuration, the electronic apparatus can detect a smaller pressure force applied onto the input operation part with the capacitive elements.

The input operation part may be a flexible display configured to display an image based on the operation signal. Thus, input operability of the input operation part can be improved.

As described above, according to the embodiments of the present disclosure, it is possible to provide a sensor unit, an input device, and an electronic apparatus, which are capable of detecting a smaller pressure force.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

BRIEF DESCRIPTION OF THE FIGURES

FIG. 3 is a block diagram of an electronic apparatus according to the first embodiment of the present disclosure;

FIGS. 11A to 11C are views showing modifications of the first structures shown in FIG. 1;

FIG. 20 is a partial cross-sectional view of a main part in the input device;

FIG. 34 is a cross-sectional view showing an input device according to a modified example shown in FIG. 27;

FIG. 35 is a cross-sectional view showing an input device according to a seventh embodiment of the present disclosure;

FIG. 40 is a main part cross-sectional view for explaining an operation of the input device shown in FIG. 35; and FIG. 41 is a main part cross-sectional view for explaining an operation of the input device shown in FIG. 27.

DETAILED DESCRIPTION

Hereinafter, embodiments of the present disclosure will be described with reference to the drawings. In some of the drawings, X, Y, and Z axes orthogonal to each other are shown and common to the respective embodiments.

First Embodiment

Entire Configuration

Figure 1:
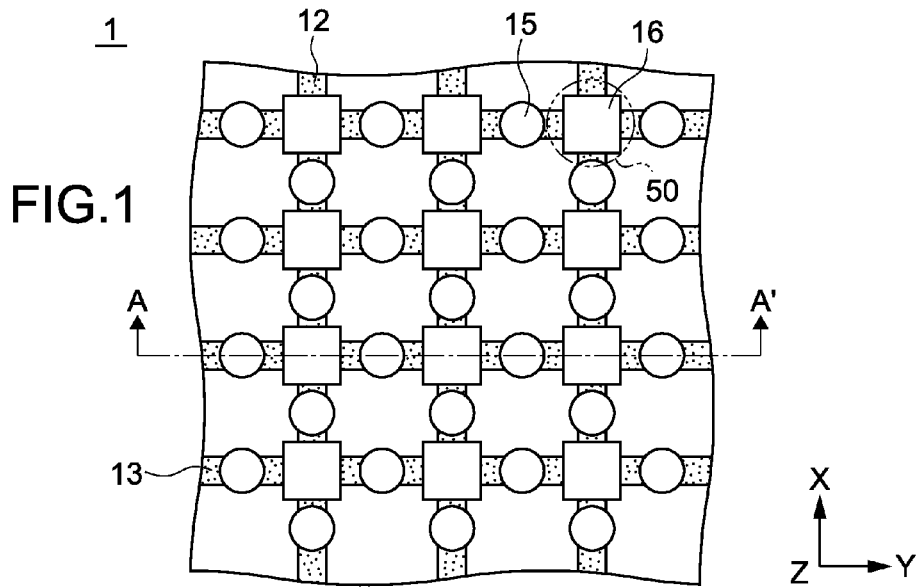
FIG. 1 is a plan view of an input device according to a first embodiment of the present disclosure.
Figure 2A:
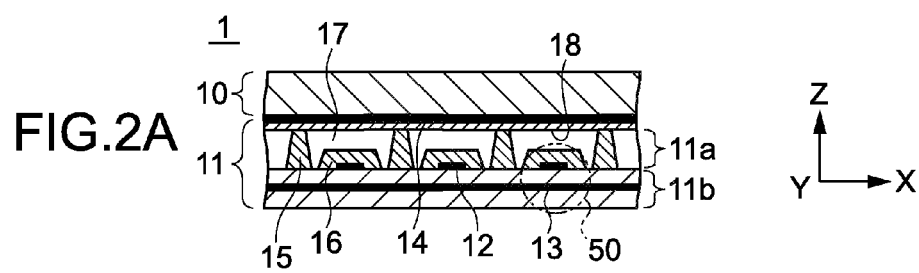
FIGS. 2A to 2C are cross-sectional views of the input device taken along the line A-A' in FIG. 1.
Figure 2B:
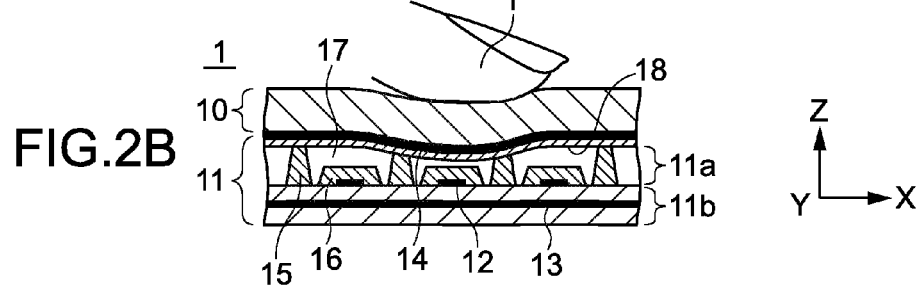
Figure 2C:
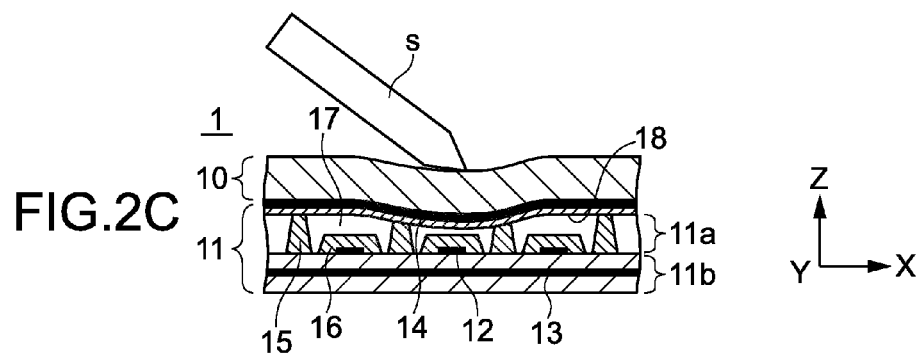

FIG. 1 is a plan view of an input device 1 according to a first embodiment of the present disclosure. FIGS. 2A to 2C are cross-sectional views of the input device 1 taken along the line A-A' in FIG. 1. FIG. 3 is a block diagram of an electronic apparatus z having the input device 1.

The input device 1 has a flexible display 10 and a sensor unit 11. In FIG. 1, the flexible display 10 is omitted, and the inner structure of the sensor unit 11 is schematically shown. The input device 1 and the flexible display 10 are each formed into a flat plate shape extending in a direction perpendicular to the Z axis.

The flexible display 10 serves not only as an input operation part of the input device 1 but also as a display part of the electronic apparatus z. That is, the flexible display 10 is operated by the user at an upper-side (front-side) surface thereof in a Z-axis direction as the input operation part of the input device 1. Further, the flexible display 10 displays an image generated by an operation of the user upward in the Z axis direction as the display part of the electronic apparatus z. Examples of an operation element for operating the flexible display 10 include a finger f shown in FIG. 2B and a stylus s shown in FIG. 2C.

As the flexible display 10, a commercially-available type can be used. Examples of such a type include so-called electronic papers, organic EL (Electro Luminescent) panels, inorganic EL panels, and liquid crystal panels.

The sensor unit 11 is arranged on the lower-side (rear-side) surface of the flexible display 10 in the Z-axis direction. In addition, the sensor unit 11 has a substrate 11$b$ including X electrodes 12 and Y electrodes 13. The X electrodes 12 and the Y electrodes 13 constitute capacitance-type capacitive elements of a mutual capacitance system. Moreover, the sensor unit 11 has a reference electrode 14. When the reference electrode 14 moves closer to the substrate 11$b$, the capacitance between the X electrodes 12 and the Y electrodes 13 changes. Typically, the reference electrode 14 is connected to ground potential.

The input device 1 has a controller c, and the controller c includes a determination part c1 (detection part) and a signal generation part c2. The determination part c1 detects an operation of the user based on a change in the capacitance (between the X electrodes 12 and the Y electrodes 13) of the sensor unit 11. The signal generation part c2 generates an operation signal based on a detection result of the determination part c1.

The electronic apparatus z shown in FIG. 3 has a processing device p that performs processing based on the operation signal generated by the signal generation part c2 of the input device 1. The operation signal processed by the processing device p is output to the flexible display 10 (input operation device) as, for example, an image signal.

(Sensor Unit)

The substrate 11$b$ has a laminated structure of a plurality of substrates including a substrate where the X electrodes 12 are formed and a substrate where the Y electrodes 13 are formed. In this embodiment, the substrate 11$b$ of a deformable type is used such that the input device 1 itself is made deformable in its thickness direction. Examples of a material that forms each of the substrates include, for example, translucent or non-translucent resin materials made of PET (Polyethylene Terephthalate), PEN (Polyethylene Naphthalate), PI (Polyimide), PC (Polycarbonate), or the like.

Note that in a case where the input device 1 is not made deformable, the substrate 11$b$ does not need to be deformable. In this case, examples of a material that forms each of the substrates include, for example, hard materials such as ceramic materials.

Here, attention is paid only to the electrodes 12, 13, and 14. The X electrodes 12, the Y electrodes 13, and the reference electrode 14 are formed on three respective surfaces, which are orthogonal to the Z axis and different from each other. Specifically, the X electrodes 12 are formed on the upper surface of the substrate 11$b$ in the Z-axis direction, the Y electrodes 13 are formed inside the substrate 11$b$, and the reference electrode 14 is formed on the lower surface of the flexible display 10 in the Z-axis direction. Accordingly, these electrode groups are arranged in the order of the reference electrode 14, the X electrodes 12, and the Y electrodes 13 from top to bottom in the Z-axis direction.

As described above, in the sensor unit 11, the X electrodes 12 and the Y electrodes 13 constitute the capacitive elements, and a change in the capacitance between the X electrodes 12 and the Y electrodes 13 is detected. On the other hand, the X electrodes 12 and the reference electrode 14 facing each other also constitute the capacitive elements. When the reference electrode 14 moves closer to the substrate 11$b$, the capacitance between the X electrodes 12 and the reference electrode 14 increases while the capacitance between the X electrodes 12 and the Y electrodes 13 decreases. Thus, in the sensor unit 11, it is possible to detect the proximity of the reference electrode 14 based on a decrease in the capacitance between the X electrodes 12 and the Y electrodes 13.

Note that in this embodiment, the reference electrode 14 is formed on the lower surface of the flexible display 10 in the Z-axis direction. However, in the sensor unit 11, the reference electrode 14 only needs to be arranged at a position facing the X electrodes 12 upward in the Z-axis direction. Accordingly, the reference electrode 14 may be independently formed or may be formed on an elastically-deformable substrate other than the flexible display 10.

The sensor unit 11 has a plurality of first structures 15 each arranged between the substrate 11$b$ and the reference electrode 14. The first structures 15 are column-shaped bodies each having a shape whose conical top is cut out to be a surface parallel to its bottom surface and whose center axis extends in the Z-axis direction. The first structures 15 are arranged in the X-axis direction and the Y-axis direction regularly (at regular intervals). The first structures 15 are each made of an elastically-deformable material. Examples of such a material include, for example, PET (Polyethylene Terephthalate), silicon resins, and sponges. The upper surfaces of the first structures 15 in the Z-axis direction and the lower surface of the reference electrode 14 in the Z-axis direction are bonded together by an adhesive layer 18. The adhesive layer 18 is made of, for example, a UV (Ultraviolet) curable resin material or the like. Note that the upper surfaces of the first structures 15 in the Z-axis direction and the lower surface of the reference electrode 14 in the Z-axis direction may be in direct contact with each other without the adhesive layer 18.

Each of the first structures 15 serves as a support member that supports the reference electrode 14 so as to be separated from the substrate 11$b$. That is, the first structures 15 form respective spaces 17 between the substrate 11$b$ and the reference electrode 14. Thus, a support layer 11$a$ including the first structures 15 and the spaces 17 is formed between the substrate 11$b$ and the reference electrode 14.

Second structures 16 are formed between the respective first structures 15 on the upper surface of the substrate 11$b$ in the Z-axis direction. As shown in FIG. 1, the second structures 16 each have a square cross section orthogonal to the Z axis and are arranged at positions where the X electrodes 12 and the Y electrodes 13 intersect each other. In addition, as shown in FIGS. 2A to 2C, the second structures 16 are lower than the first structures 15 (or the support layer 11$a$). Therefore, the spaces 17 are formed between the second structures 16 and the reference electrode 14.

FIG. 2B shows a state where the flexible display 10 is operated by the finger f of the user. In this state, the finger f applies a force onto the flexible display 10 downward in the Z-axis direction. At this time, the flexible display 10 is deflected downward in the Z-axis direction. The reference electrode 14 bonded to the flexible display 10 is deflected downward in the Z-axis direction together with the flexible display 10 and moves closer to the substrate 11b. Thus, the capacitance of the sensor unit 11 decreases.

As described above, the second structures 16 are formed between the reference electrode 14 and the substrate 11b. Because a material that forms the second structures 16 has a larger specific inductive capacity than air existing in the spaces 17, the capacitance between the X electrodes 12 and the reference electrode 14 is larger compared with a structure where the second structures 16 are not provided. The larger the capacitance between the X electrodes 12 and the reference electrode 14, the larger a change in the capacitance between the X electrodes 12 and the reference electrode 14 with a displacement of the reference electrode 14 to the side of the X electrodes 12 becomes.

On the other hand, the larger a change in the capacitance between the X electrodes 12 and the reference electrode 14, the larger a change in the capacitance between the X electrodes 12 and the Y electrodes 13 becomes. Accordingly, in the sensor unit 11, a change in the capacitance between the X electrodes 12 and the Y electrodes 13 with a displacement of the reference electrode 14 to the side of the X electrodes 12 becomes large with an operation of the second structures 16. Therefore, even if a displacement of the reference electrode 14 to the side of the X electrodes 12 is small, the sensor unit 11 can detect the displacement. In other words, the sensor unit 11 has high sensitivity for detecting a pressure force generated when the user operates the flexible display 10.

As shown in FIG. 2B, when the flexible display 10 is pressed by the finger f and deformed downward, the first structures 15 provided below the flexible display 10 are elastically deformed. Therefore, when the finger f is separated from the flexible display 10, the flexible display 10 and the reference electrode 14 are pressed up by the elastic restoration force of the first structures 15, whereby the input device 1 is restored to its state shown in FIG. 2A.

FIG. 2C shows a state where the flexible display 10 is operated by the stylus s. Even in a case where the stylus s is used as an operation element, the same operation is performed as in a case where the finger f is used as an operation element as shown in FIG. 2B. As a material that forms the stylus s, a hard material sufficient to press the flexible display 10 can be used. Examples of such a material include, for example, metal materials and resin materials such as plastic.

(Electrode Configuration of Sensor Unit)

Figure 4:
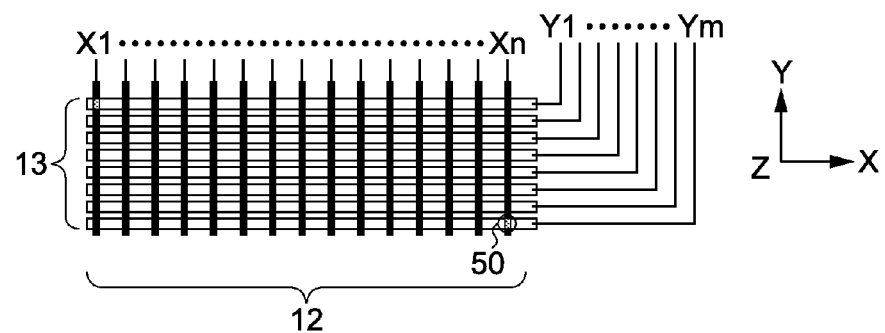
FIG. 4 is a plan view showing the electrode configuration of the input device shown in FIG. 1.

FIG. 4 is a plan view as seen from the upper side of the sensor unit 11 in the Z-axis direction and shows only the X electrodes 12 and the Y electrodes 13 of the sensor unit 11. The X electrodes 12 and the Y electrodes 13 are constituted of a plurality of wiring electrodes arranged parallel to each other and form so-called a cross matrix. The sensor unit 11 has n columns of the X electrodes 12 extending over the entire range in the Y-axis direction thereof and m rows of the Y electrodes 13 extending over the entire range in the X-axis direction thereof. The X electrodes 12 are arranged over the entire range of the input device 1 in the X-axis direction, and the Y electrodes 13 are arranged over the entire range of the input device 1 in the Y-axis direction.

In the sensor unit 11, the capacitive elements shown in FIGS. 2A to 2C are formed at the positions where the X electrodes 12 and the Y electrodes 13 intersect each other.

Accordingly, the sensor unit 11 has n×m pieces of capacitive elements 50. In the sensor unit 11, the larger the values of n and m, the higher the density of the capacitive elements in the XY plane becomes. Therefore, the sensor unit 11 can more precisely detect an operated position.

(Controller)

The controller c is typically constituted of a CPU (Central Processing Unit) or a MPU (Micro-Processing Unit). In this embodiment, the controller c has the determination part c1 and the signal generation part c2 and performs various functions according to a program stored in a storage unit (not shown). The determination part c1 determines a state of the flexible display 10 based on an electric signal (input signal) output from the sensor unit 11, and the signal generation part c2 generates an operation signal based on a determination result of the determination part c1.

In addition, the controller c has a drive circuit that drives the input device 1. The drive circuit outputs a drive signal to each of the capacitive elements 50 at predetermined time intervals. Moreover, the determination part c1 processes an output from each of the capacitive elements 50 in response to the drive signal and determines an input operation of the user on the input device 1.

Figure 5:
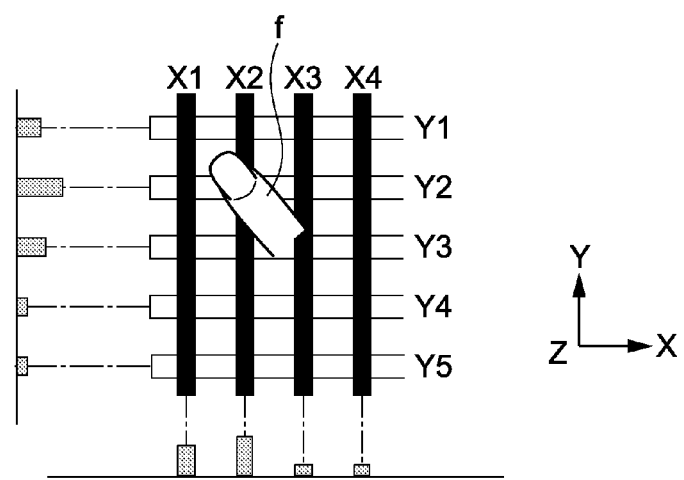
FIG. 5 is a view showing an example of an output signal output from the input device shown in FIG. 1.

FIG. 5 is a view showing an example of an output signal output from the sensor unit 11 when the flexible display 10 is operated by the finger f of the user. In FIG. 5, a bar graph shown along the X axis represents change amounts of the capacitance of arbitrary capacitive elements formed by the X electrodes 12 relative to reference capacitance. In addition, in FIG. 5, a bar graph shown along the Y axis represents change amounts of the capacitance of arbitrary capacitive elements formed by the Y electrodes 13 relative to reference capacitance.

The determination part c1 of the controller c shown in FIG. 3 calculates coordinates of a position operated by the finger f in the X-axis direction and the Y-axis direction in the flexible display 10 based on the change amounts of the capacitance acquired from the X electrodes 12 and the Y electrodes 13. That is, in FIG. 5, the determination part c1 calculates the X coordinate of the position operated by the finger f based on a ratio of the change amounts of the capacitance formed by the X electrodes 12 (X1, X2, X3, and X4) in the sensor unit 11. In addition, the determination part c1 calculates the Y coordinate of the position operated by the finger f based on a ratio of the change amounts of the capacitance formed by the Y electrodes 13 (Y1, Y2, Y3, and Y4) in the sensor unit 11. Thus, the determination part c1 outputs the coordinates of the operated position on the flexible display 10 to the signal generation part c2 (see FIG. 3).

As a value for evaluating whether the flexible display 10 is being operated, the determination part c1 can use a maximum value of the change amounts of the capacitance of the capacitive elements formed by the X electrodes 12 or the Y electrodes 13.

In addition, as a value for evaluating whether the flexible display 10 is being operated, the determination part c1 can also use an added value of the change amounts of the capacitance of the capacitive elements formed by the X electrodes 12 (which is the added value of the values of the bar graph shown along the X axis in FIG. 5 and will be referred to as an X added value). Moreover, instead of the X added value, the determination part c1 may also use an added value of the change amounts of the capacitance of the capacitive elements formed by the Y electrodes 13 (which is the added value of the values of the bar graph shown along the Y axis in FIG. 5 and will be referred to as a Y added value). Furthermore, instead of the X added value and the Y added value, the determination part c1 may also use a combined value of the X added value and the Y added value.

Specifically, a threshold is set in the determination part c1. If the above evaluation value is larger than or equal to the threshold, the determination part c1 determines that the flexible display 10 is being operated. Then, the determination part c1 outputs the determination result to the signal generation part c2 (see FIG. 3). The signal generation part c2 generates an operation signal based on an output signal from the determination part c1.

In the determination part c1, the threshold may be arbitrarily set. For example, the threshold may be set at a low value for users such as women and children whose finger strength is weak or may be set at a high value for users whose finger strength is strong.

Thus, the input device 1 according to this embodiment can precisely determine an operated position of the flexible display 10.

(Structure of Support Layer)

In this embodiment, the reference electrode 14 and the flexible display 10 are supported by the substrate 11b via the support layer 11a as described above. The support layer 11a supports the reference electrode 14 and the flexible display 10 only with the plurality of first structures 15 shown in FIG. 1 and FIGS. 2A to 2C on the substrate 11b.

In this embodiment, even if the user operates the input device 1 with a smaller pressure force, it is possible to obtain a sufficient downward displacement of the reference electrode 14 and the flexible display 10 in the Z-axis direction according to the configuration of the support layer 11a.

Next, simulations performed to examine the configuration of the support layer 11a will be described.

(1) First Simulation

Figure 6A:
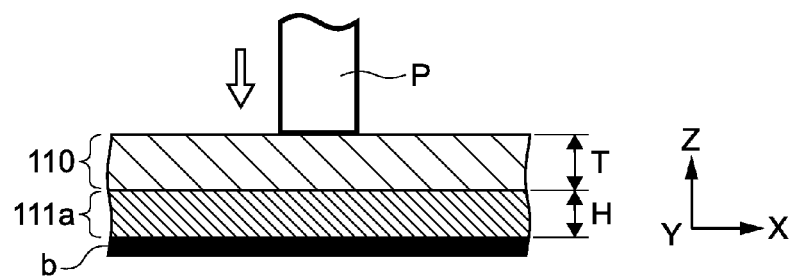
FIGS. 6A and 6B are an explanatory view and a graph each showing a first simulation.

FIG. 6A is a schematic configuration view showing a first simulation. This simulation was performed assuming that a support layer was filled with a single material unlike the support layer 11a according to this embodiment.

As shown in FIG. 6A, this simulation employed a model including a sheet 110 having the same Young's modulus E as that of the flexible display 10 according to this embodiment, a support layer 111a filled with a single material having various Young's moduli E, and a substrate b made of a sufficiently hard material. A thickness T of the sheet 110 was set at 300 μm, 500 μm, or 800 μm, and the lower surface of the support layer 111a in the Z-axis direction was restrained by the substrate b.

In the model shown in FIG. 6A, it was assumed that the sheet 110 was operated with a small pressure force, and calculation was performed on the condition that the sheet 110 was pressed with a constant force (0.25 N) by a column-shaped pressure element P having a diameter of 3 mm.

Figure 6B:
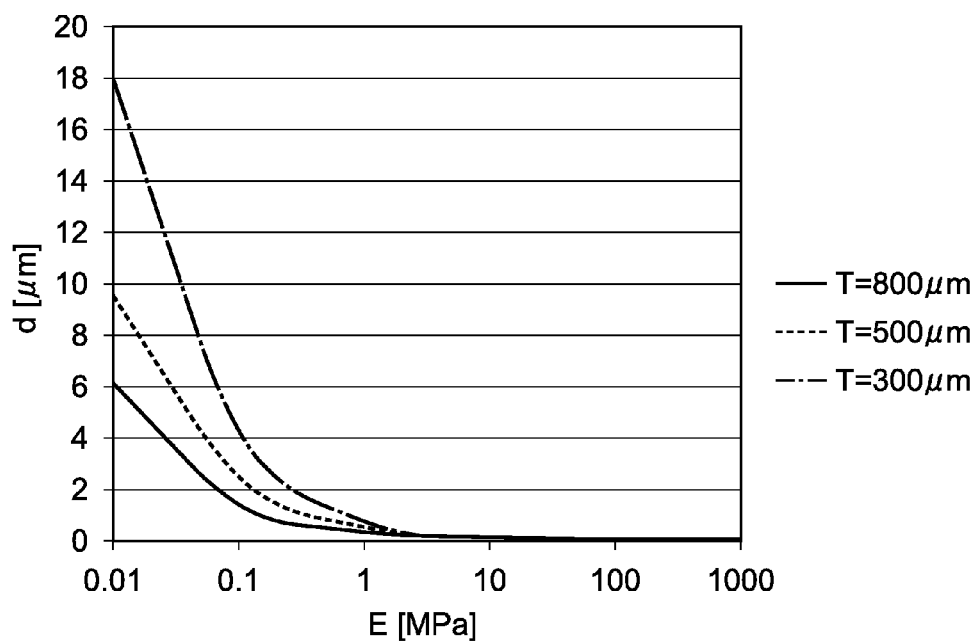

FIG. 6B shows results obtained by calculating a displacement d of the lower surface of the sheet 110 in the Z-axis direction. In FIG. 6B, the horizontal axis indicates the Young's modulus E of the material filled in the support layer 111a, and the vertical axis indicates the displacement d of the lower surface of the sheet 110 in the Z-axis direction.

The results of this simulation show that the displacement d tends to be larger if the Young's modulus E of the material filled in the support layer 111a is smaller and tends to be larger if the thickness T of the sheet 110 is smaller.

The thickness T of the sheet 110 is actually determined according to a design of an electronic apparatus. Particularly, in a case where the flexible display 10 is employed as the sheet 110 as in this embodiment, it may be technically difficult to reduce the thickness T. Accordingly, in order to sufficiently increase the displacement d of the lower surface of the sheet 110 in the Z-axis direction, it is desirable to use one having a sufficiently small Young's modulus E as the material filled in the support layer 111a.

In this embodiment, if the displacement d of the lower surface of the sheet 110 in the Z-axis direction is larger than or equal to 1 μm when the sheet 110 is operated by the user in the manner as shown in FIGS. 2B and 2C, it is possible to sufficiently detect a change in the capacitance of the sensor unit 11. Further, the flexible display 10 according to this embodiment has a thickness of 800 μm.

Accordingly, in this embodiment, it is desirable that the displacement d of the lower surface of the sheet 110 in the Z-axis direction be larger than or equal to 1 μm on the condition that the thickness (T) of the sheet 110 is 800 μm. To this end, it is necessary for the material filled in the support layer 111a to have a Young's modulus E of smaller than or equal to 0.1 MPa.

However, a general-purpose silicon resin has a Young's modulus E of about several tens to several hundreds MPa. Even a sponge having a small Young's modulus E has a Young's modulus of about one to ten MPa at the lowest possible level. Moreover, even a special sponge formed to have a smaller Young's modulus E has difficulty having a Young's modulus E of smaller than or equal to 0.1 MPa.

As described above, there is a limit on an expected Young's modulus E of a single material. Therefore, it is found that, in this embodiment, a sufficient displacement d with an operation of the user is difficult to be obtained according to the configuration where the support layer 11a is filled with a single material.

(2) Second Simulation

Figure 7A:
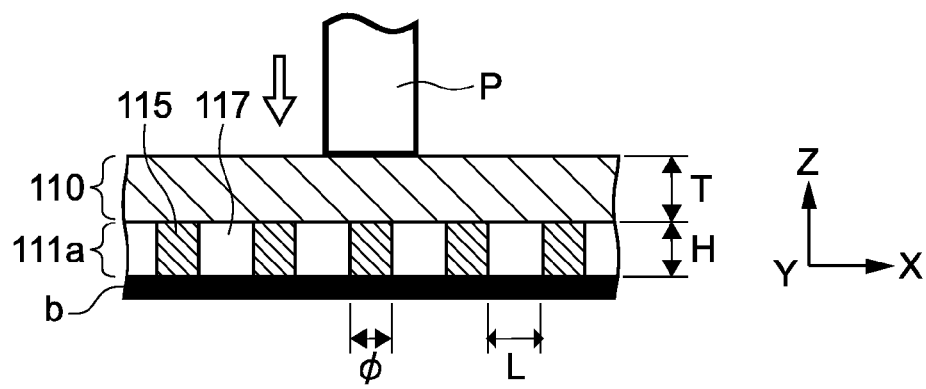
FIGS. 7A and 7B are an explanatory view and a graph each showing a second simulation.
Figure 8A:
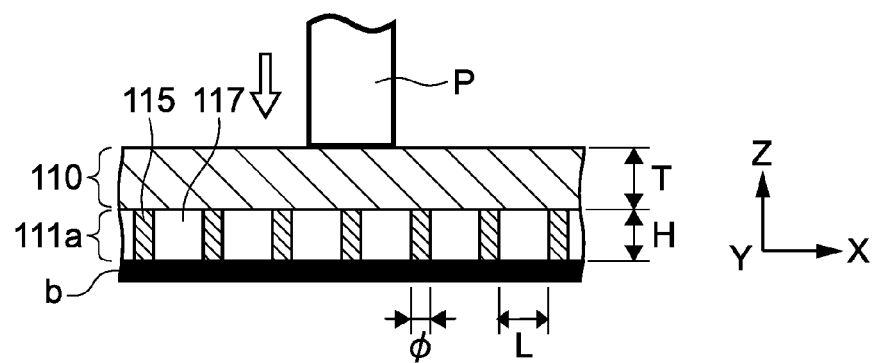
FIGS. 8A and 8B are an explanatory view and a graph each showing the second simulation.

FIGS. 7A and 8A are schematic configuration views showing a second simulation. Unlike the configuration of the first simulation where a single material is filled in the support layer 111a, this simulation examined a configuration where column-shaped first structures 115 are arranged in the X-axis direction and the Y-axis direction at intervals in the support layer 111a. In this configuration, the first structures 115 and spaces 117 are alternately arranged in the X-axis direction and the Y-axis direction in the support layer 111a.

First, as shown in FIG. 7A, with a diameter φ of the first structures 115 set at 100 μm, calculation was performed on the following four models where a Young's modulus E of a material forming the first structures 115 and an interval L between the first structures 115 were changed.

Model a: E=2 GPa, L=1 mm
Model b: E=2 GPa, L=2 mm
Model c: E=100 MPa, L=1 mm
Model d: E=100 MPa, L=2 mm In the same manner as the first simulation, the calculation was performed on each of the models on the condition that the sheet 110 was pressed with a constant force (0.25 N) by a column-shaped pressure element P having a diameter of 3 mm.

Figure 7B:
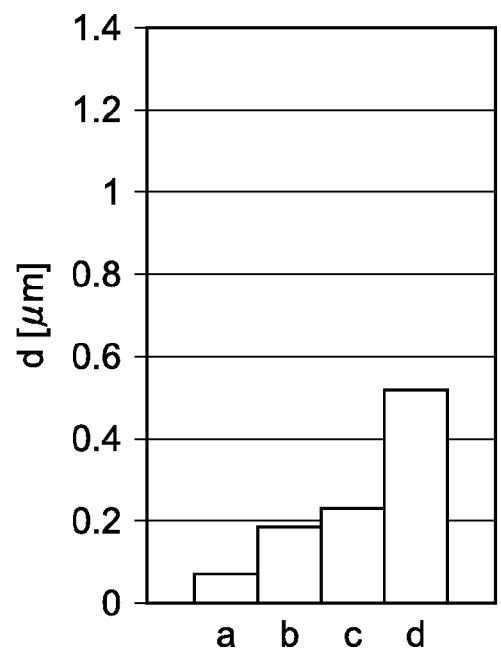

FIG. 7B shows results obtained by calculating the displacement d of the lower surface of the sheet 110 in the Z-axis direction. In FIG. 7B, the horizontal axis indicates the names of the models, and the vertical axis indicates the displacement d of the lower surface of the sheet 110 in the Z-axis direction.

The results of this simulation show that the displacement d of the lower surface of the sheet 110 in the Z-axis direction tends to be larger if the Young's modulus E of the material forming the first structures 115 is smaller and tends to be larger if the interval between the first structures 115 is larger.

In this simulation, the large displacement d is obtained in spite of a value of the Young's modulus E of the material forming the first structures 115. This is because the sheet 110 in this simulation is supported only at parts thereof corresponding to the first structures 115 of the support layer 111a while the sheet 110 in the first simulation is supported by the entire support layer 111a.

That is, in this simulation, because the hardness of the support layer 111a in the Z-axis direction (hereinafter referred to as an "apparent Young's modulus E'") was degraded with a reduction in the areas of the support layer 111a supporting the sheet 110, the large displacement d was obtained.

Accordingly, in order to reduce the apparent Young's modulus E' of the support layer 111a, it is effective to reduce the areas of the support layer 111a supporting the sheet 110. To this end, there are a method of reducing the diameter φ of the first structures 115 and a method of increasing the interval L between the first structures 115. However, if the interval L between the first structures 115 is too large, the support layer 111a may not properly support the sheet 110. Therefore, the method of reducing the diameter φ of the first structures 115 was used.

As shown in FIG. 8A, with a diameter φ of the first structures 115 reduced from 100 μm to 50 μm, calculation was performed on the following four models where the Young's modulus E of the material forming the first structures 115 and the interval L between the first structures 115 were changed.

Model a: E=2 GPa, L=1 mm
Model b: E=2 GPa, L=2 mm
Model c: E=100 MPa, L=1 mm
Model d: E=100 MPa, L=2 mm In the same manner as the first simulation, the calculation was performed on each of the models on the condition that the sheet 110 was pressed with a constant force (0.25 N) by a column-shaped pressure element P having a diameter of 3 mm.

Figure 8B:
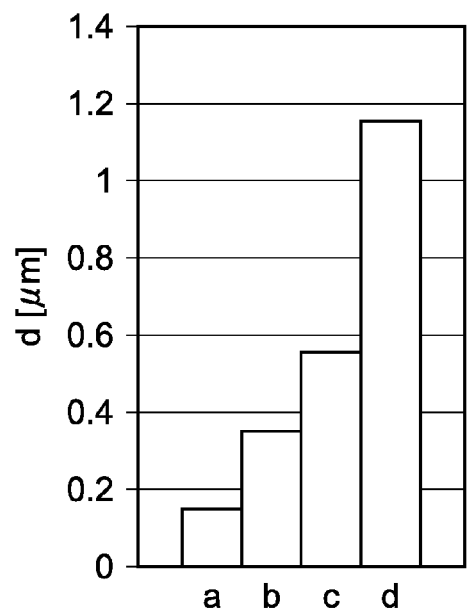

FIG. 8B shows results obtained by calculating the displacement d of the lower surface of the sheet 110 in the Z-axis direction. In FIG. 8B, the horizontal axis indicates the names of the models, and the vertical axis indicates the displacement d of the lower surface of the sheet 110 in the Z-axis direction. In all the models, the displacement d of the lower surface of the sheet 110 in the Z-axis direction was larger than that of the first simulation. Particularly, in the model d (E=100 MPa, L=2 mm), the displacement d was larger than 1 μm, and the apparent Young's modulus E' of the support layer 111a was smaller than or equal to 0.1 MPa.

The first and second simulations result in the configuration where the reference electrode 14 and the flexible display 10 are supported only by the first structures 15 in the support layer 11a according to this embodiment.

(First Structures)

Figure 9A:
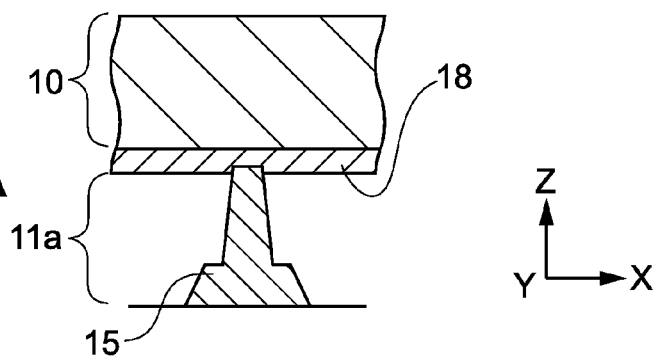
FIGS. 9A to 9C are views showing modifications of first structures shown in FIG. 1.
Figure 9B:
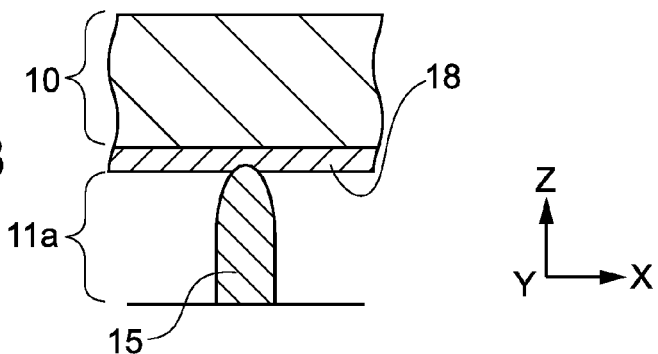
Figure 9C:
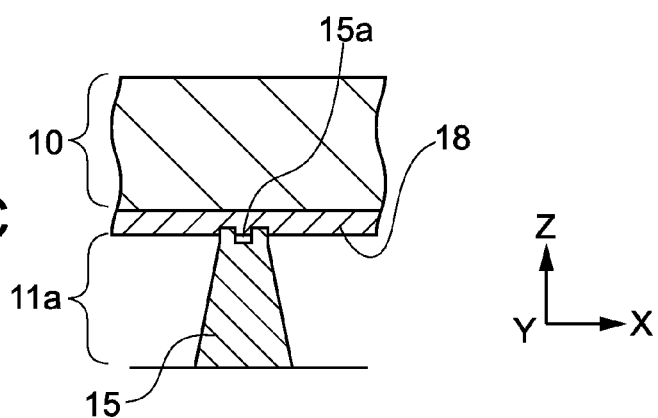

The first structures 15 may be each formed into any shape other than the shape shown in FIGS. 2A to 2C and the column shape shown in the above simulations. For example, the first structures 15 may be each formed into a shape having a step in the Z-axis direction as shown in FIG. 9A, a shape having a dome at an upper part thereof as shown in FIG. 9B, and a shape having a groove 15a at an upper end thereof as shown in FIG. 9C. In this case, such a shape can increase its compression deformation amount in the Z-axis direction compared with the column-shaped structure. In addition, if the structures having a dome shape have a larger curvature, they can obtain a larger deformation amount. Further, the first structures 15 does not need to be each formed into a shape whose cross section orthogonal to the Z axis is a circle like a column (cone). The first structures 15 may be each formed into a shape whose cross section orthogonal to the Z axis is a polygon, such as a quadrangular prism (quadrangular pyramid) and a triangular prism (triangular pyramid).

Figure 10A:
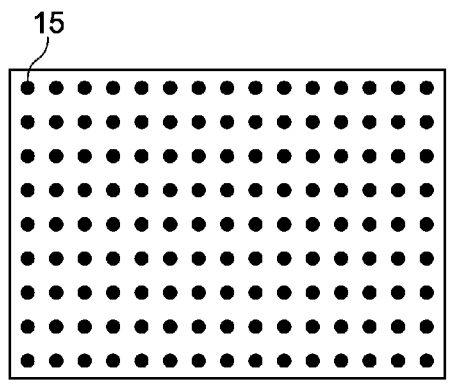
FIGS. 10A to 10D are views showing modifications of the first structures shown in FIG. 1.
Figure 10B:
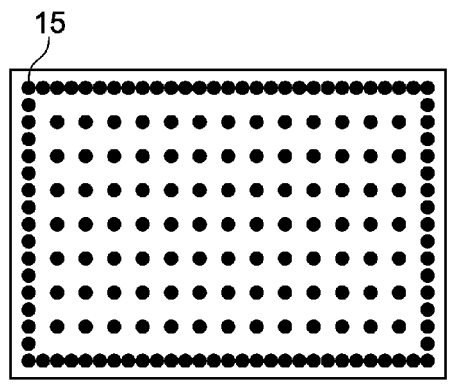
Figure 10C:
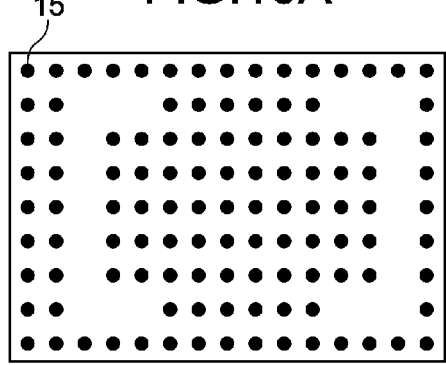
Figure 10D:
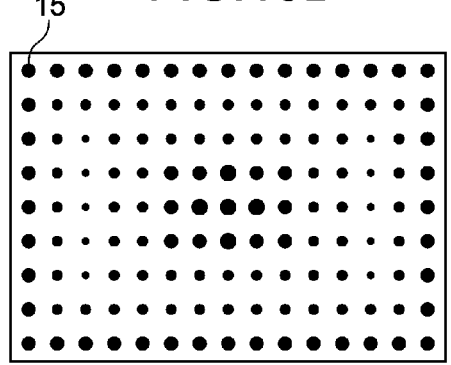

Further, the first structures 15 does not need to be uniformly arranged on the entire XY plane as shown in FIG. 10A. For example, the first structures 15 may be densely arranged only at outer peripheral parts thereof as shown in FIG. 10B and may be arranged to exclude certain areas as shown in FIG. 10C. In addition, the first structures 15 may be different in their sizes as shown in FIG. 10D.

Moreover, the first structures 15 does not need to be each formed into a column shape. For example, the first structures 15 may be formed into a wall shape. Examples of the structure having such a shape include a structure having lattice shapes as shown in FIG. 11A, a structure where rectangles each having a different diameter are combined together as shown in FIG. 11B, and a structure radially extending as shown in FIG. 11C.

(Second Structures)

As described above, when the capacitance between the X electrodes 12 and the reference electrode 14 increases, the second structures 16 increase a change in the capacitance between the X electrodes 12 and the Y electrodes 13 with a displacement of the reference electrode 14 to the side of the X electrodes 12.

Next, simulations performed to examine the configuration of the second structures 16 will be described.

(3) Third Simulation

Figure 12A:
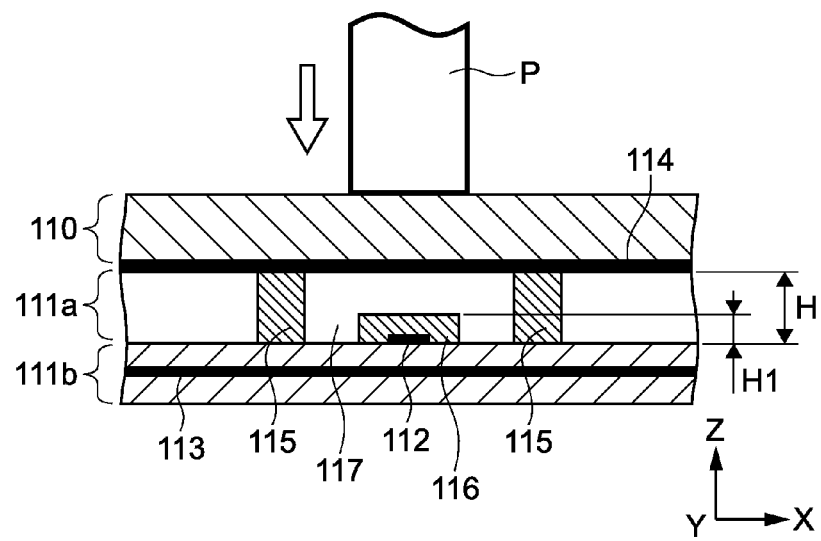
FIGS. 12A and 12B are an explanatory view and a graph each showing a third simulation.

FIG. 12A is a schematic configuration view showing a third simulation. In this simulation, a thickness of second structures 116 in the Z-axis direction was examined. To this end, a model shown in FIG. 12A the same as that of this embodiment was used. This model was constituted of the sheet 110, the support layer 111a, and a substrate 111b. Like the input device 1 according to this embodiment, the substrate 111b had X electrodes 112 and Y electrodes 113, and the sheet 110 had reference electrode 114 on the lower surface thereof in the Z-axis direction.

The first structures 115 were arranged in the support layer 111a such that the spaces 117 each having a height H in the Z-axis direction were formed between the substrate 111b and the reference electrode 114. The second structures 116 were arranged at positions where the X electrodes 112 and the Y electrodes 113 intersected each other. In addition, the second structures 116 were each formed into a shape whose cross section orthogonal to the Z axis was a square and each having a height H1 in the Z-axis direction.

In the model shown in FIG. 12A, calculation was performed on the condition that the sheet 110 was pressed by a column-shaped pressure element P having a diameter of 5 mm and the lower surface of the sheet 110 was displaced by 3 μm in the Z-axis direction. A value of the height H was set at 30 μm or 50 μm. A size of the initial capacitance between the X electrodes 112 and the Y electrodes 113 was set at 3 pF.

Figure 12B:
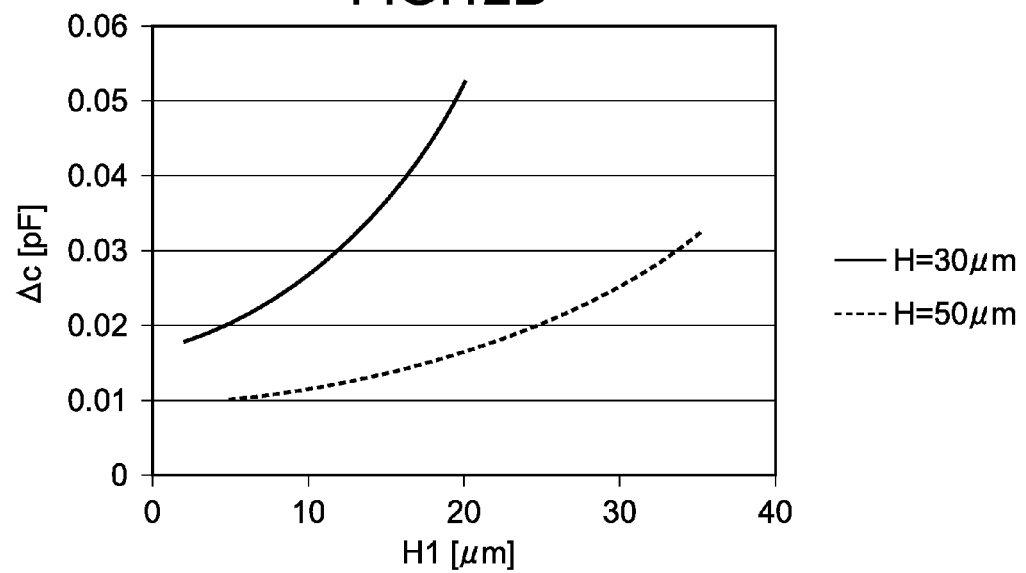

FIG. 12B is a graph showing a change in a change value ΔC of the capacitance relative to a size of the height H1 before and after the sheet 110 is pressed by the pressure element P. It is found that, regardless of whether the height H was 30 μm or 50 μm, the change value ΔC of the capacitance becomes larger if the value of the height H1 of the second structures 116 is larger.

Based on the this simulation, it is found that the sensitivity of the sensor unit 11 is improved due to the fact that the change in the capacitance becomes larger if the second structures 16 according to this embodiment are higher.

(4) Fourth Simulation

Figure 13A:
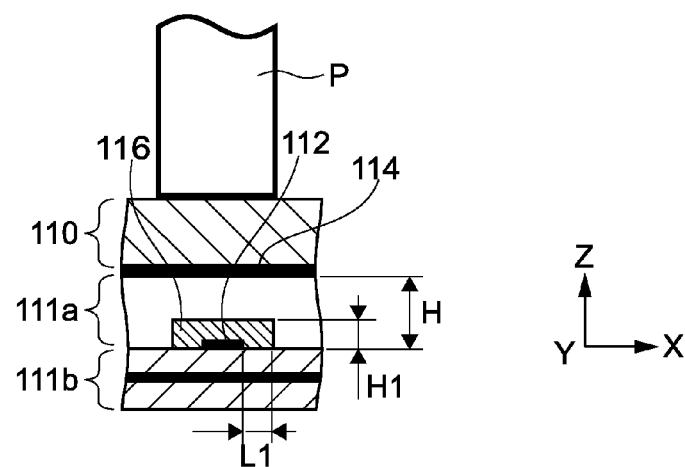
FIGS. 13A and 13B are an explanatory view and a graph each showing a fourth simulation.

FIG. 13A is a schematic configuration view showing a fourth simulation. In this simulation, widths of the second structures 11b in the X-axis direction and the Y-axis direction were examined using a simulation model shown in FIG. 13A. The height H of the support layer 111a was set at 50 μm, and the height H1 of the second structures 116 was set at 30 μm. A length outside the X electrodes 112 of the second structures 116 was set at L1.

Figure 13B:
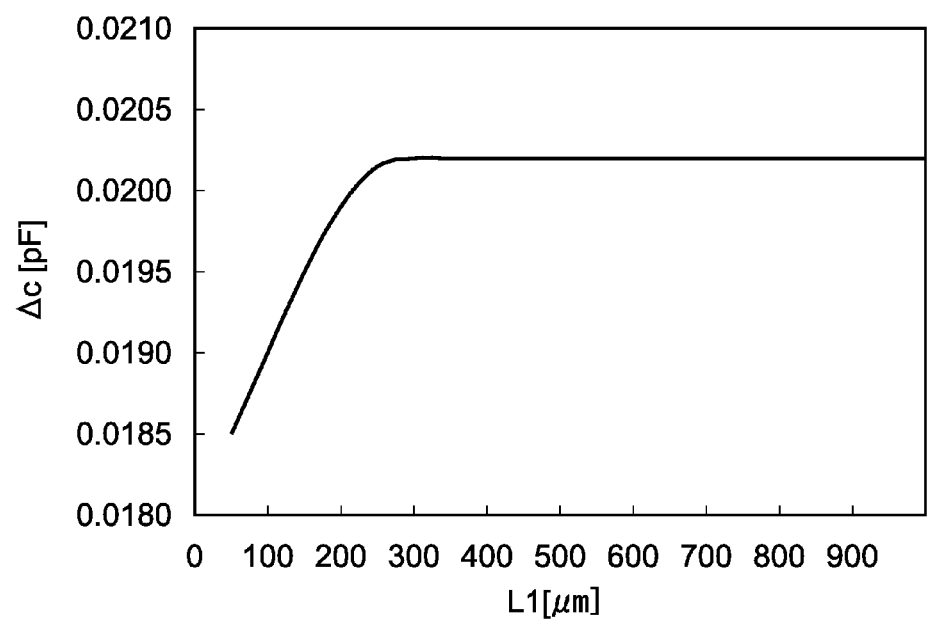

FIG. 13B is a graph showing a change in a change value ΔC of the capacitance relative to a size of the height H1 before and after the sheet 110 is pressed by the pressure element P. It is found that the change value Δc of the capacitance is satisfactorily obtained if the length L1 outside the X electrodes 112 of the second structures 116 is larger than or equal to 300 μm.

Note that it is only necessary for the second structures 16 to be formed inside the support layer 11a and the second structures 16 are not particularly limited in their shapes. In this embodiment, the second structures 16 are each formed into a shape whose cross section orthogonal to the Z axis is a square. However, the second structures 16 may be each formed into a shape whose cross section orthogonal to the Z axis is a circle or any polygon. In addition, the second structures 16 may be each formed into a shape whose outer shape is partially or entirely formed by a curved surface.

(Method of Forming First and Second Structures)

Figure 14A:
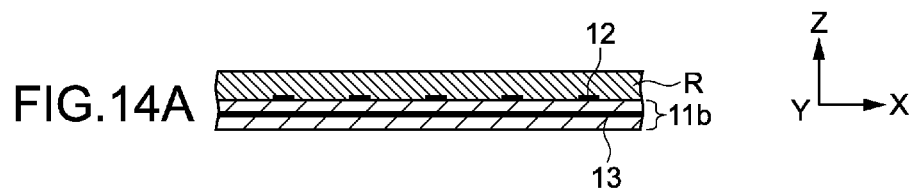
FIGS. 14A to 14C are views showing an example of a method of forming the first structures and second structures shown in FIG. 1.
Figure 14B:
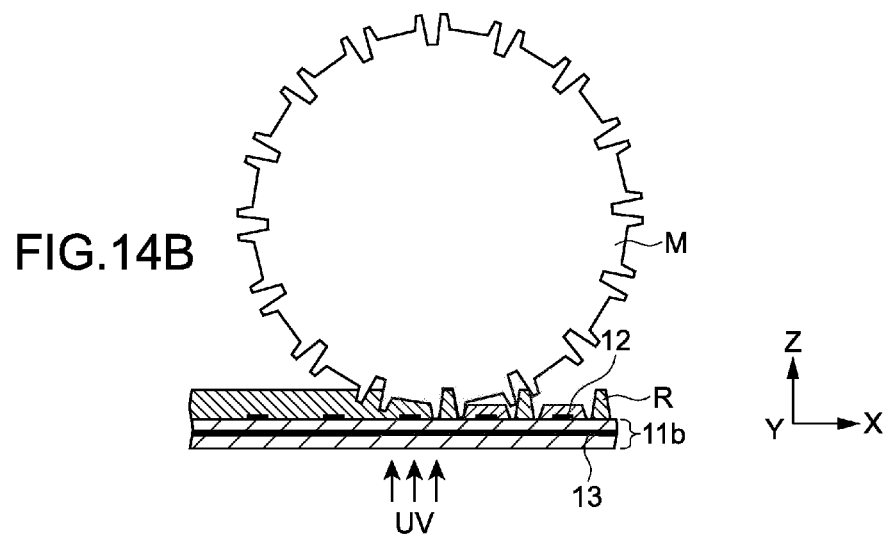
Figure 14C:
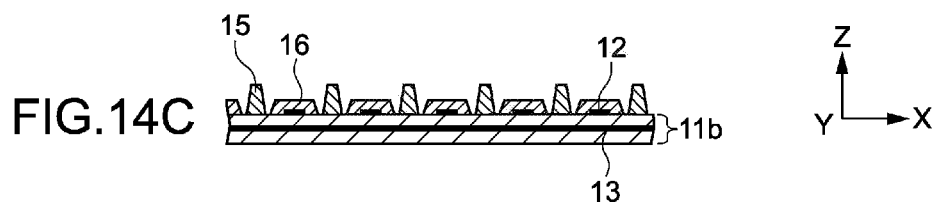

FIGS. 14A to 14C are views showing a method of forming the first structures 15 and the second structures 16 of the input device 1 according to this embodiment. First, as shown in FIG. 14A, a UV resin R is coated on the translucent substrate 11b. As the resin R, a solid sheet material or a liquid UV curable material may be used. Then, as shown in FIG. 14B, a concavoconvex-shaped pattern of a mold M is transferred onto the UV resin R by the roll-shaped mold M having the predetermined concavoconvex-shaped pattern, and at the same time the UV resin R is irradiated with UV light from the side of the substrate 11b so as to be cured. Thus, as shown in FIG. 14C, the first structures 15 and the second structures 16 are formed on the substrate 11b. Note that forming of the first structures 15 and the second structures 16 is not limited to the above method using the UV resin but may be based on, for example, typical thermoforming (such as press molding and injection molding) or ejection of a resin material using a dispenser or the like.

(Modifications of Configuration of Support Layer)

Figure 15A:
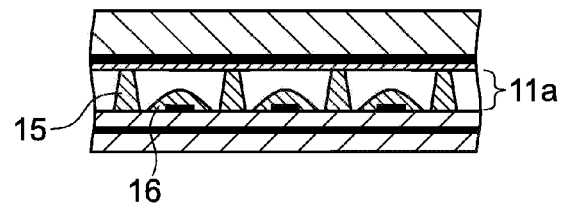
FIGS. 15A to 15F are views showing modifications of a support layer shown in FIG. 1.
Figure 15B:
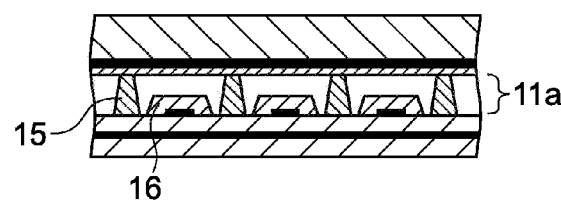

FIGS. 15A to 15F show modifications of the support layer 11a according to this embodiment. As shown in FIG. 15A, the support layer 11a may have the dome-shaped second structures 16 whose upper surface in the Z-axis direction is a curved surface. In addition, as shown in FIG. 15B, the second structures 16 may be made of a material different from that of the first structures 15 in the support layer 11a.

Figure 15C:
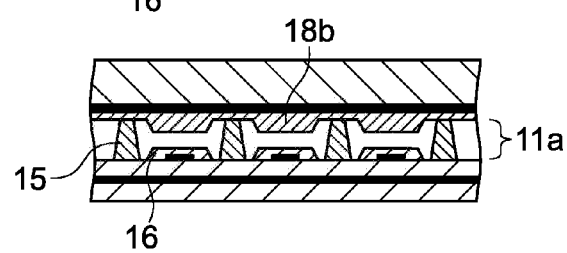

Moreover, as shown in FIG. 15C, the support layer 11a may have different second structures 18b upward in the Z-axis direction besides the second structures 16 downward in the Z-axis direction in such a manner that the adhesive layer 18 is protruded downward. In this case, the second structures 18b increase the capacitance between the X electrodes 12 and the reference electrode 14 as in the second structures 16. The support layer 11a may have at least one of the second structures 16 and the second structures 18b. Note that both of the second structures 16 and the second structures 18b may be omitted as occasion demands.

Figure 15D:
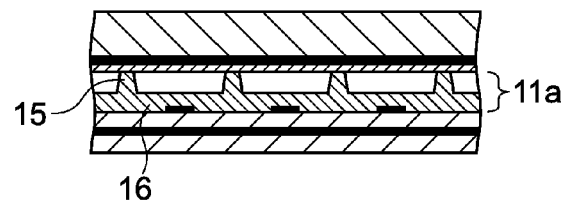
Figure 15E:
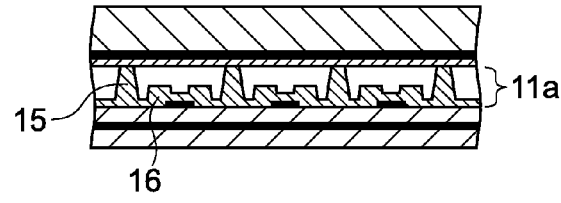
Figure 15F:
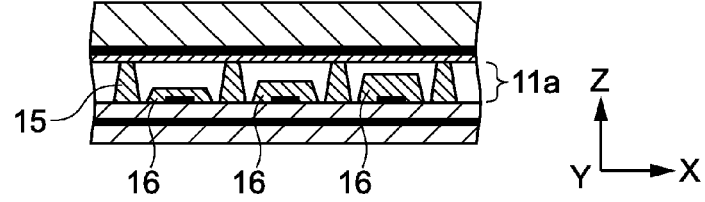

Furthermore, in the support layer 11a, the first structures 15 and the second structures 16 may be formed in succession as shown in FIG. 15D, steps may be formed in the upper surfaces of the second structures 16 in the Z-axis direction as shown in FIG. 15E, and heights of the second structures 16 may be different from each other as shown in FIG. 15F.

Second Embodiment

Figure 16A:
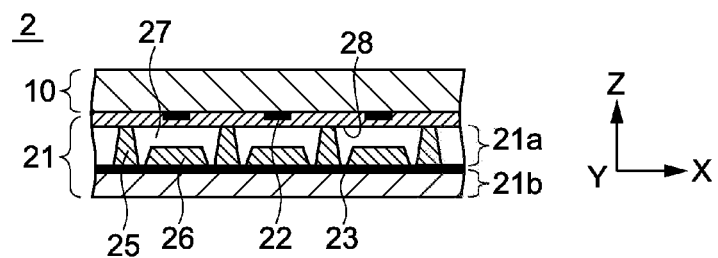
FIGS. 16A to 16C are cross-sectional views of an input device according to a second embodiment of the present disclosure.
Figure 16B:
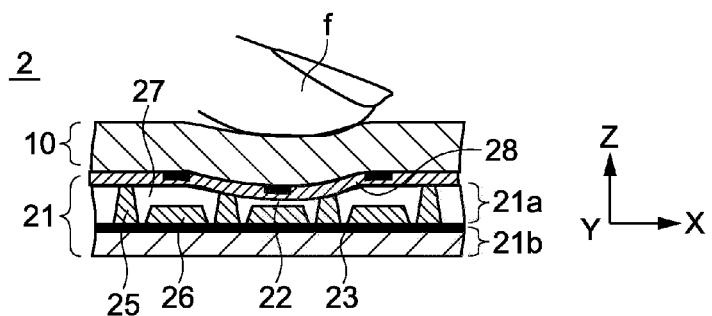
Figure 16C:
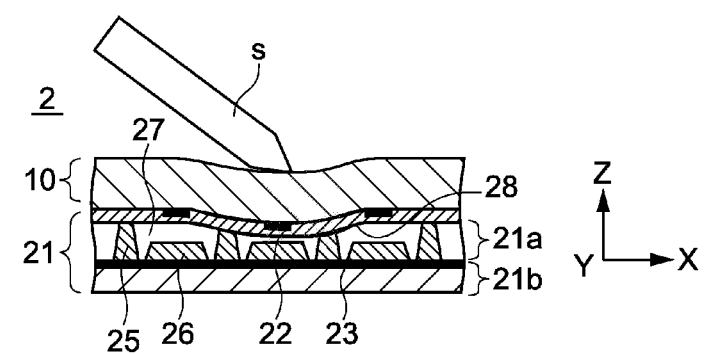

FIGS. 16A to 16C are partial cross-sectional views of an input device 2 according to a second embodiment of the present disclosure. The configuration of the input device 2 according to this embodiment is the same as that of the input device 1 according to the first embodiment except for a sensor unit 21, and thus a description thereof will be appropriately omitted. FIGS. 16A to 16C correspond to FIGS. 2A to 2C according to the first embodiment, respectively.

(Entire Configuration)

The input device 2 according to this embodiment has the sensor unit 21 different from the sensor unit 11 according to the first embodiment and the flexible display 10 the same as that of the first embodiment. The sensor unit 21 has X electrodes 22 and Y electrodes 23 facing each other. The X electrodes 22 and the Y electrodes 23 constitute capacitance-type capacitive elements of a self-capacitance system. Further, in the sensor unit 21, the capacitance between the X electrodes 22 and the Y electrodes 23 increases when the X electrodes 22 move closer to the Y electrodes 23.

(Sensor Unit)

The Y electrodes 23 are formed on the upper surface of a substrate 21b in the Z-axis direction. On the other hand, the X electrodes 22 are formed on the lower surface of the flexible display 10 in the Z-axis direction. The sensor unit 21 is capable of detecting the proximity of the X electrodes 22 to the Y electrodes 23 based on a decrease in the capacitance between the X electrodes 22 and the Y electrodes 23.

The sensor unit 21 has a plurality of first structures 25 arranged between the substrate 21b and the flexible display 10. The first structures 25 have the same configuration as the first structures 15 according to the first embodiment. The upper surfaces of the first structures 25 in the Z-axis direction and the lower surface of the flexible display 10 in the Z-axis direction are bonded together by an adhesive layer 28. Thus, a support layer 21a including the first structures 25 and spaces 27 is formed between the substrate 21b and the flexible display 10.

On the upper surface of the substrate 21b in the Z-axis direction, second structures 26 are formed between the respective first structures 25. The second structures 26 have the same configuration as the second structures 16 according to the first embodiment.

FIG. 16B shows a state where the flexible display 10 is operated by the finger f of the user. In this state, the finger f applies a force onto the flexible display 10 downward in the Z-axis direction. At this time, the flexible display 10 is deflected downward in the Z-axis direction. The X electrodes 22 bonded to the flexible display 10 are deflected downward in the Z-axis direction together with the flexible display 10 and move closer to the substrate 21b. Thus, the capacitance of the sensor unit 21 increases.

As described above, the second structures 26 are formed between the flexible display 10 and the substrate 21b. Because a material that forms the second structures 26 has a larger specific inductive capacity than air existing in the spaces 27, the capacitance between the X electrodes 22 and the Y electrodes 23 is larger compared with a structure where the second structures 26 are not provided. Therefore, even if a displacement of the X electrodes 22 to the side of the Y electrodes 23 is small, the sensor unit 21 can detect the displacement. In other words, the sensor unit 21 has high sensitivity for detecting a pressure force generated when the user operates the flexible display 10.

FIG. 16C shows a state where the flexible display 10 is operated by the stylus s. Even in a case where the stylus s is used as an operation element, the same operation is performed as in a case where the finger f is used as an operation element as shown in FIG. 16B.

Third Embodiment

Figure 17A:
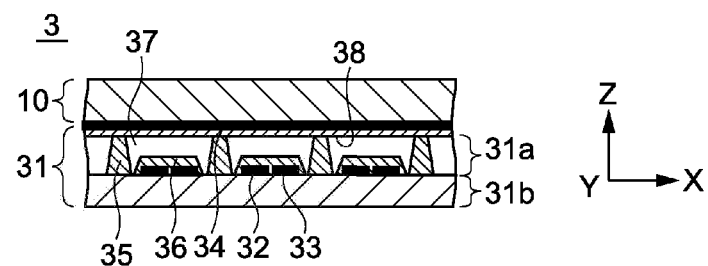
FIGS. 17A to 17C are cross-sectional views of an input device according to a third embodiment of the present disclosure.
Figure 17B:
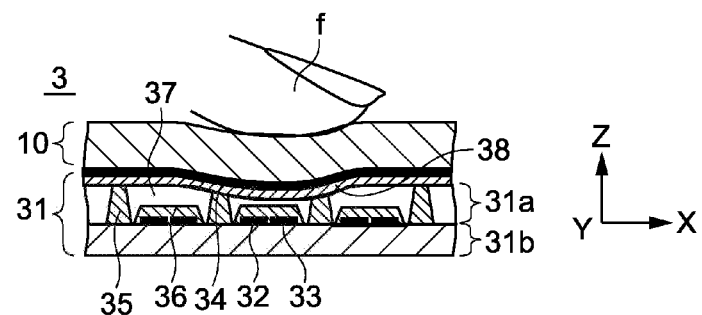
Figure 17C:
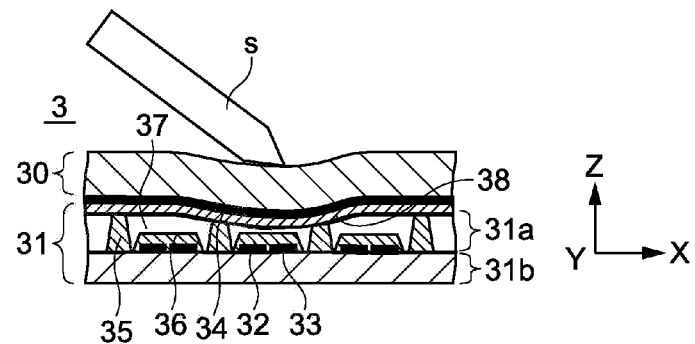

FIGS. 17A to 17C are partial cross-sectional views of an input device 3 according to a third embodiment of the present disclosure. The configuration of the input device 3 according to this embodiment is the same as that of the input device 1 according to the first embodiment except for a sensor unit 31, and thus a description thereof will be appropriately omitted. FIGS. 17A to 17C correspond to FIGS. 2A to 2C according to the first embodiment, respectively.

(Entire Configuration)

The input device 3 according to this embodiment has the sensor unit 31 different from the sensor unit 11 according to the first embodiment and the flexible display 10 the same as that of the first embodiment. The sensor unit 31 has a substrate 31b including first electrodes 32 and second electrodes 33. The first electrodes 32 and the second electrodes 33 constitute capacitance-type capacitive elements of a mutual-capacitance system. In addition, the sensor unit 31 has a reference electrode 34. In the sensor unit 31, the capacitance between the first electrodes 32 and the second electrodes 33 decreases when the reference electrode 34 moves closer to the substrate 31b. Typically, the reference electrode 34 is connected to ground potential.

(Sensor Unit)

The first electrodes 32 and the second electrodes 33 arranged side by side along the X axis are formed on the upper surface of the substrate 31b in the Z-axis direction. The reference electrode 34 is formed on the lower surface of the flexible display 10 in the Z-axis direction. The sensor unit 31 is capable of detecting the proximity of the reference electrode 34 to the substrate 31b based on a decrease in the capacitance between the first electrodes 32 and the second electrodes 33.

The sensor unit 31 has a plurality of first structures 35 arranged between the substrate 31b and the reference electrode 34. The first structures 35 have the same configuration as the first structures 15 according to the first embodiment. The upper surfaces of the first structures 35 in the Z-axis direction and the lower surface of the reference electrode 34 in the Z-axis direction are bonded together by an adhesive layer 38. Thus, a support layer 31a including the first structures 35 and spaces 37 is formed between the substrate 31b and the flexible display 10.

On the upper surface of the substrate 31b in the Z-axis direction, second structures 36 are formed between the respective first structures 35. The second structures 36 have the same configuration as the second structures 16 according to the first embodiment.

FIG. 17B shows a state where the flexible display 10 is operated by the finger f of the user. In this state, the finger f applies a force onto the flexible display 10 downward in the Z-axis direction. At this time, the flexible display 10 is deflected downward in the Z-axis direction. The reference electrode 34 bonded to the flexible display 10 is deflected downward in the Z-axis direction together with the flexible display 10 and moves closer to the substrate 31b. Thus, the capacitance of the sensor unit 31 decreases.

As described above, the second structures 36 are formed between the reference electrode 34 and the substrate 31b. Because a material that forms the second structures 36 has a larger specific inductive capacity than air existing in the spaces 37, the capacitance between the first electrodes 32 and the second electrodes 33 is larger compared with a structure where the second structures 36 are not provided. Therefore, even if a displacement of the reference electrode 34 to the side of the substrate 31b is small, the sensor unit 31 can detect the displacement. In other words, the sensor unit 31 has high sensitivity for detecting a pressure force generated when the user operates the flexible display 10.

FIG. 17C shows a state where the flexible display 10 is operated by the stylus s. Even in a case where the stylus s is used as an operation element, the same operation is performed as in a case where the finger f is used as an operation element as shown in FIG. 17B.

Fourth Embodiment

Figure 18A:
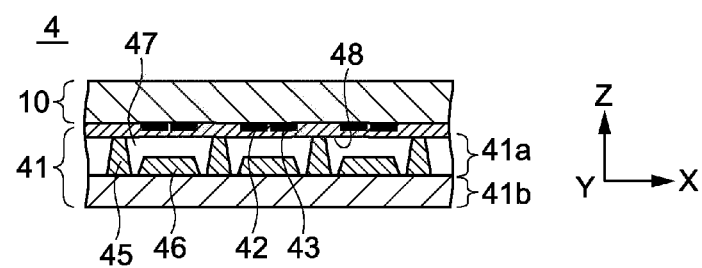
FIGS. 18A to 18C are cross-sectional views of an input device according to a fourth embodiment of the present disclosure.
Figure 18B:
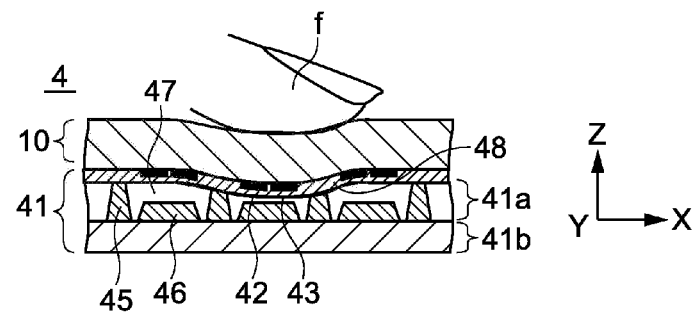
Figure 18C:
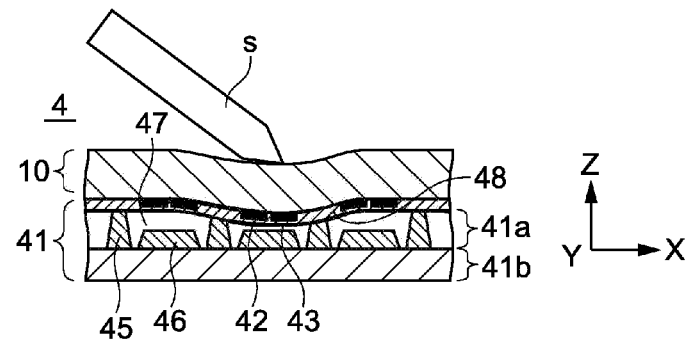

FIGS. 18A to 18C are partial cross-sectional views of an input device 4 according to a fourth embodiment of the present disclosure. The configuration of the input device 4 according to this embodiment is the same as that of the input device 1 according to the first embodiment except for a sensor unit 41, and thus a description thereof will be appropriately omitted. FIGS. 18A to 18C correspond to FIGS. 2A to 2C according to the first embodiment, respectively.

(Entire Configuration)

The input device 4 according to this embodiment has the sensor unit 41 different from the sensor unit 11 according to the first embodiment and the flexible display 10 the same as that of the first embodiment. The sensor unit 41 has a substrate 41b and an adhesive layer where first electrodes 42 and second electrodes 43 are provided. The first electrodes 42 and the second electrodes 43 constitute capacitance-type capacitive elements of a mutual capacitance system.

(Sensor Unit)

In the sensor unit 41, the first electrodes 42 and the second electrodes 43 arranged side by side along the X axis are formed on the upper surface of the flexible display 10 in the Z-axis direction.

The sensor unit 41 has a plurality of first structures 45 arranged between the substrate 41b and the flexible display 10. The first structures 45 have the same configuration as the first structures 15 according to the first embodiment. The upper surfaces of the first structures 45 in the Z-axis direction and the lower surface of the flexible display 10 in the Z-axis direction are bonded together by an adhesive layer 48. Thus, a support layer 41a including the first structures 45 and spaces 47 is formed between the substrate 41b and the flexible display 10.

On the upper surface of the substrate 41b in the Z-axis direction, second structures 46 are formed between the respective first structures 45. The second structures 46 have the same configuration as the second structures 16 according to the first embodiment.

FIG. 18B shows a state where the flexible display 10 is operated by the finger f of the user. In this state, the finger f applies a force onto the flexible display 10 downward in the Z-axis direction. At this time, the flexible display 10 is deflected downward in the Z-axis direction. The first electrodes 42 and the second electrodes 43 bonded to the flexible display 10 are deflected downward in the Z-axis direction together with the flexible display 10 and move closer to the second structures 46.

As described above, the second structures 46 are formed between the flexible display 10 and the substrate 41b. Because a material that forms the second structures 46 has a larger specific inductive capacity than air existing in the spaces 47, the capacitance between the first electrodes 42 and the second electrodes 43 increases when the first electrodes 42 and the second electrodes 43 move closer to the second structures 46.

Even in a case where the input device 4 does not have the second structures 46, the capacitance between the first electrodes 42 and the second electrodes 43 increases when the first electrodes 42 and the second electrodes 43 move closer to the substrate 41b. However, because the input device 4 according to this embodiment has the second structures 46 besides the substrate 41b, the capacitance between the first electrodes 42 and the second electrodes 43 significantly increases compared with a structure where the second structures 46 are not provided.

Therefore, even if displacements of the first electrodes 42 and the second electrodes 43 to the side of the substrate 41b are small, the sensor unit 41 can detect the displacements. In other words, the sensor unit 41 has high sensitivity for detecting a pressure force generated when the user operates the flexible display 10.

FIG. 18C shows a state where the flexible display 10 is operated by the stylus s. Even in a case where the stylus s is used as an operation element, the same operation is performed as in a case where the finger f is used as an operation element as shown in FIG. 18B.

Fifth Embodiment

Figure 19:
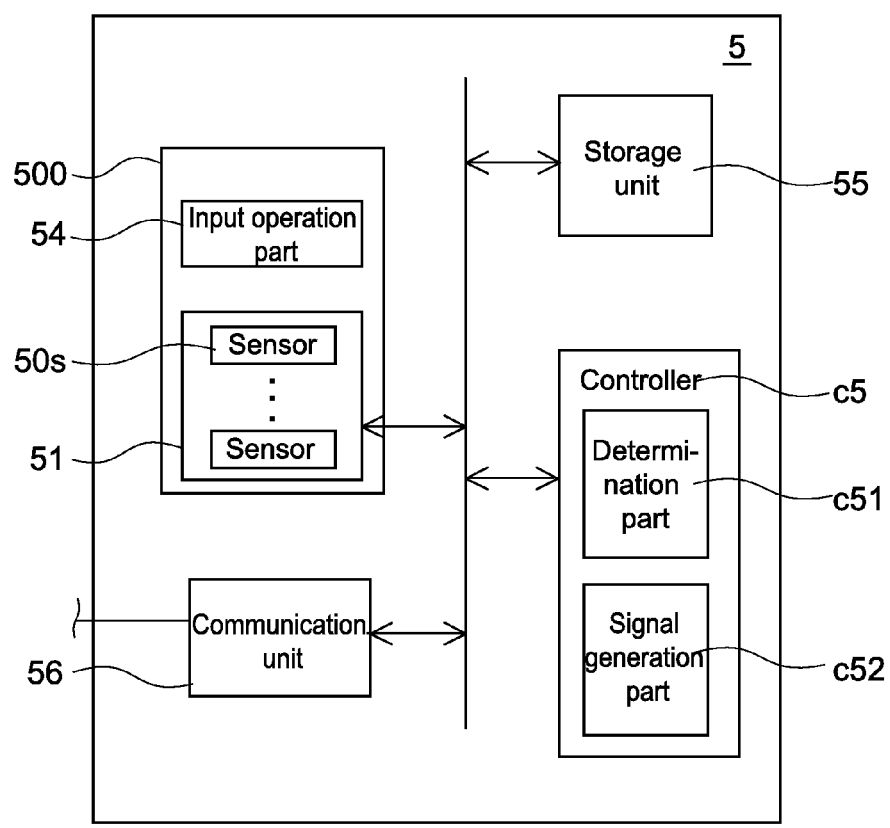
FIG. 19 is a block diagram showing the configuration of an input device according to a fifth embodiment of the present disclosure.

FIG. 19 is a block diagram showing the configuration of an input device 5 according to a fifth embodiment of the present disclosure.

(Entire Configuration)

The input device 5 has a sensor unit 500, a controller c5, a storage unit 55, and a communication unit 56.

(Sensor Unit)

The sensor unit 500 has a sensor matrix 51 and an input operation part 54. The sensor matrix 51 has a plurality of sensors 50s and outputs a detection signal depending on a touch operation or a press operation on the input operation part 54. The input operation part 54 constitutes the same input operation surface as that of a keyboard or the like that receives a press operation and constitutes the same input operation surface as that of a track pad or the like that receives a touch operation.

FIG. 20 is a partial cross-sectional view of the sensor unit 500. The sensor unit 500 has a surface 51 (first surface) corresponding to the rear surface of the input operation part 54 and having the reference electrode 14 arranged thereon, a surface S2 (second surface) of the substrate 11b having the X electrodes 12 arranged thereon, and an inner surface S3 (third surface) of the substrate 11b having the Y electrodes 13 arranged thereon. The sensor matrix 51 has the laminated structure of the support layer 11a and the substrate 11b according to the first embodiment, and individual capacitance components formed at the intersection areas between the plurality of X electrodes 12 and the plurality of Y electrodes 13 constitute the plurality of sensors 50s.

Each of the sensors 50s is arranged on an XY plane in the same key arrangement as, for example, a keyboard for a typical personal computer. Each of the sensors 50s has a predetermined size and shape according to its arrangement and assigned function. Each of the sensors 50s may be constituted of a single capacitive element or may be constituted of a plurality of capacitive elements.

Each of the sensors 50s constitutes a capacitance-type sensor unit of a mutual capacitance system. The capacitive element constituting each of the sensors 50s corresponds to the capacitive element 50 according to the first embodiment and outputs the detection signal related to either the touch operation or the press operation of the user based on the capacitance between the X electrodes 12 and the Y electrodes 13, the capacitance changing according to the operation of the user on the input operation part 54.

The input operation part 54 is constituted of the flexible display 10 according to the first embodiment. In this case, letters and designs of the same key arrangement as those of typical keyboards for use in personal computers are displayed on the input operation part 54. Besides, the input operation part 54 may be constituted of a metal or composite resin cover where letters and designs of the same key arrangement as those of typical keyboards are drawn.

(Controller)

The controller c5 corresponds to the controller c according to the first embodiment and includes a determination part c51 (detection part) and a signal generation part c52. Based on a change in the capacitance of each of the sensors 50s, the determination part c51 determines a first state where the finger f (operation element) is in contact with any of the sensors 50s and determines a change from the first state to a second state where the finger f presses the sensor 50s. Based on the determination of the determination part c51, the signal generation part c52 generates different operation signals depending on whether the user is in a state of touching the input operation part 54 or in a state of pressing the input operation part 54.

The capacitance of the capacitive element constituting each of the sensors 50s changes approximately linearly relative to a change in the distance between the reference electrode 14 and the substrate 11b as in the first embodiment. Thus, a difference in the size of a pressure force applied onto the input operation part 54 can be easily detected. For example, it becomes possible to discriminate between the touch operation and the press operation on the input operation part 54 depending on whether a change amount of the capacitance exceeds a predetermined threshold.

For example, in a state where the user lightly puts the finger f on an operation surface 54a (FIG. 20) of the input operation part 54, a light force is applied onto the operation surface 54a. On the other hand, when the user performs the key press operation, a heavier load is applied onto the operation surface 54a in the state where the user lightly puts the finger f on the operation surface 54a. In the sensor unit 500, the capacitance of each of the sensors 50s increases and decreases according to an amount of the force. The load can be estimated based on the size of a value corresponding to the change in the capacitance. Accordingly, it is possible to discriminate between the touch state where the user lightly puts the finger f and the press state where the user presses the operation surface 54a.

Here, in a case where the controller c5 outputs key information only in the press state at user's key input, the user can have a feeling as if he/she operated a typical keyboard. In this case, the sensor unit 500 can recognize a position of the finger f based on a change amount of the capacitance of each of the sensor 50s in the touch state. Thus, the sensor unit 500 can detect coordinates of the touched position and discriminate the input of the user.

On the other hand, the input device 5 according to this embodiment can detect coordinates in the X and Y directions on the operation surface 54a and detect a size of the load applied onto the operation surface 54a with high accuracy. Using this effect, it becomes possible to perform new inputs as follows.

Input Example 1

In a case where the input operation part 54 is constituted of a flexible display, a magnification ratio of an image displayed on the input operation part 54 may be changed according to the force to press the operation surface 54a. For example, a map is displayed as an image, and the display of the image is controlled such that the display of a pressed position changes with a magnification ratio in proportion to a pressing amount.

Input Example 2

In a case where the input device 5 is applied to an electronic apparatus such as a portable video game machine, the sensor unit may be used as an operation key for operating a gas pedal or a brake pedal of an automobile. Thus, the user can have an acceleration feeling or a deceleration feeling according to a pressing amount.

Input Example 3

In a case where the user sees a plurality of photographs or documents in the input operation part 54 constituted of a flexible display, a page forwarding speed may be changed according to a pressing force applied onto the operation surface 54a. For example, the user can forward pages one by one by lightly pressing the operation surface 54a or can forward the pages in units of a plurality of sheets by heavily pressing the operation surface 54a.

Input Example 4

In a case where the user performs a drawing operation on the input operation part 54 constituted of a flexible display, a thickness and a color of a drawn line may be changed according to a pressing degree. Thus, the user can perform an input with a feeling close to an actual drawing feeling.

The storage unit 55 is constituted of a RAM (Random Access Memory), a ROM (Read Only Memory), other semiconductor memories, and the like and stores calculated coordinates of an operated position of the finger or the like of the user, a program for use in various operations with the determination part c51, or the like. For example, the ROM is constituted of a nonvolatile memory and stores appropriate threshold data for determining the touch operation and the press operation on the input operation part 54, a program for causing the determination part c51 to perform operation processing such as calculation of an operated position, or the like.

The threshold data of a change amount of the capacitance of each of the sensors 50s stored in the storage unit 55 may be appropriately changed. The threshold data may be common to each of the sensors 50s or may be different for each of the sensors 50s. That is, the sensitivity of predetermined one or more of the sensors 50s can be made different from that of the other of the sensors 50s according to positions of the sensors 50s and key types.

For example, the detection sensitivity of the individual sensors 50s constituting the sensor matrix 51 can be measured in such a manner that an output of each of the sensors 50s is detected in a state where a metal plate having a predetermined weight is placed on the operation surface 54a of the input operation part 54. In this case, the threshold data for determining, for example, the touch operation may be set for each of the sensors 50s and stored in the storage unit 55. Thus, a difference in the characteristics between the sensors 50s can be reduced, or some of the sensors 50s can have desired sensitivity characteristics.

The communication part 56 is capable of transmitting various operation signals generated by the signal generation part c52 to the processing device p (see FIG. 3). In order to transmit the signals, the communication part c53 may be based on wired communication via a USB (Universal Serial Bus) or the like or may be based on wireless communication using "Wi-Fi (registered trademark)," "Bluetooth (registered trademark)," or the like.

The signal generation part c52 generates the operation signals according to the output signals from the determination part c51. Specifically, the signal generation part c52 generates the different operation signals depending on whether the user is in a state of touching the input operation part 54 or in a state of pressing the input operation part 54. In addition, when it is determined by the determination part c51 that the user is in the press state, the signal generation part c52 generates the unique operation signal for each sensor 50s corresponding to each key of a keyboard.

(Electrode Configuration)

In the sensor unit 500 shown in FIG. 20, the reference electrode 14 supported by the support layer 11a is deflected toward the side of the substrate 11b by the press operation on the operation surface 54a, and the capacitance of the sensor 50s right below a pressed position decreases. Thus, the touch operation or the press operation at the pressed position is detected.

Figure 21A:
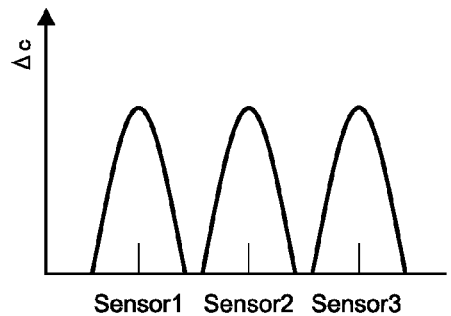
FIGS. 21A to 21D are graphs for explaining an example of characteristics of a sensor matrix where a plurality of sensors are two-dimensionally arranged.
Figure 21B:
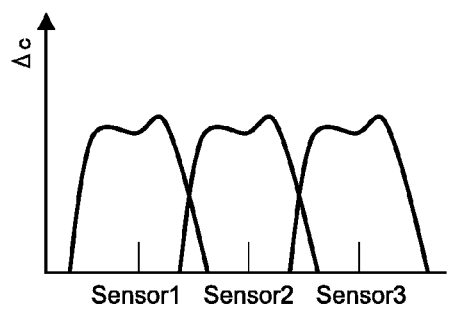
Figure 21C:
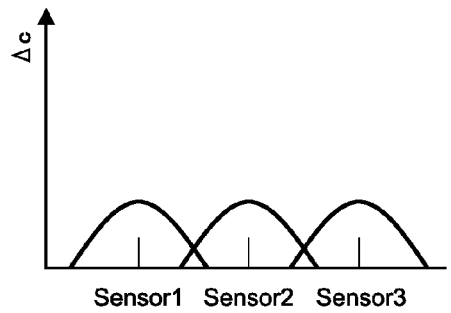

In the sensor matrix where the plurality of sensors are two-dimensionally arranged, it is desired that the sensor characteristics of the adjacent sensors and the individual sensors be of high accuracy. For example, FIG. 21A shows an example where the sensitivity areas of the adjacent sensors are not overlapped with each other. In this case, the detection sensitivity between the adjacent sensors may be reduced. FIG. 21B shows an example where the capacitance does not change with an excellent linearity. In this case, it becomes difficult to discriminate between the touch operation and the press operation. FIG. 21C shows an example where the change amounts of the capacitance of the individual sensors are small. In this case, it becomes difficult to determine an input position. Accordingly, in the sensor matrix, it is desired that the sensitivity areas of the adjacent sensors be overlapped with each other, the capacitance of the individual sensors change with an excellent linearity, and the change amounts of the capacitance of the individual sensors be large, as shown in FIG. 21D.

Figure 21D:
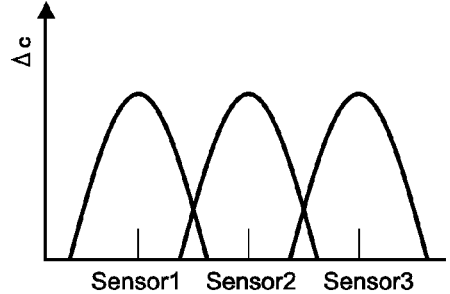
Figure 22:
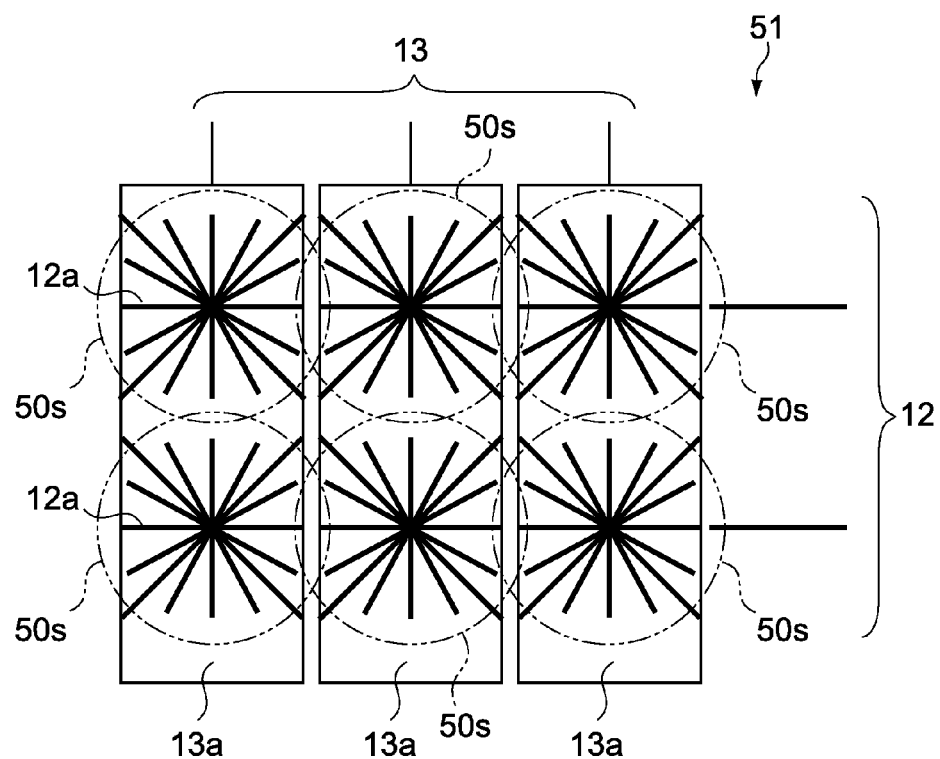
FIG. 22 is a partial plan view schematically showing a configuration example of electrodes of the sensor matrix.

In order to sufficiently secure the sensor characteristics shown in FIG. 21D, the X electrodes 12 and the Y electrodes 13 of the sensors 50s in this embodiment are each configured in a manner as shown in, for example, FIG. 22. FIG. 22 is a partial plan view of the sensor matrix 51 and shows only the X electrodes 12 and the Y electrodes 13.

In this embodiment, the X electrodes 12 are arranged between the Y electrodes 13 and the reference electrode 14. The reference electrode 14 is typically connected to ground potential. The X electrodes 12 close to the reference electrode 14 include aggregates of linear electrodes 12a, and the Y electrodes 13 distant from the reference electrode 14 include planar electrodes 13a. The linear electrodes 12a correspond to the example of the electrode shown in FIG. 11C. The sensors 50s are formed at respective intersection areas where the linear electrodes 12a and the planar electrodes 13a intersect each other.

The aggregates of the linear electrodes 12a are constituted of aggregates of a plurality of linear electrode patterns radially extending from their central parts. The linear electrodes 12a are formed to have a line width of, for example, smaller than or equal to 200 μm. The X electrodes 12 and the Y electrodes 13 are formed by, for example, a screen printing method.

In the sensor matrix 51 having such an electrode configuration, the facing areas between the X electrodes 12 and the Y electrodes 13 become small, and both of the X electrodes 12 and the Y electrodes 13 can be capacitively coupled to the reference electrode 14. Thus, because a change amount of the capacitance can be increased even if a displacement amount of the reference electrode 14 is minute, the linearity of a change in the capacitance and the detection sensitivity are increased. In addition, because the individual linear electrodes 12a have their sensitivity areas, sensitivity at the valleys between the adjacent sensors 50s can be easily secured.

Figure 23A:
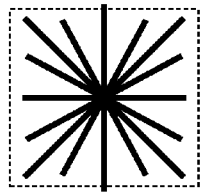
FIGS. 23A to 23P are schematic views showing configuration examples of the electrodes.
Figure 23B:
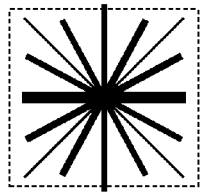
Figure 23C:
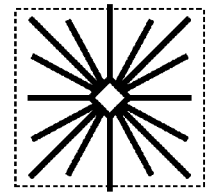
Figure 23D:
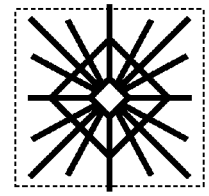
Figure 23E:
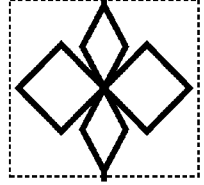
Figure 23F:
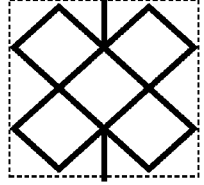
Figure 23G:
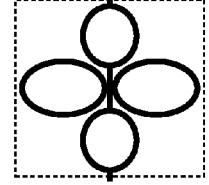
Figure 23H:
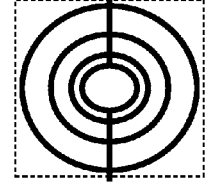
Figure 23I:
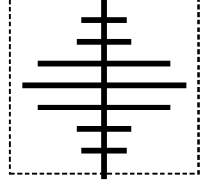
Figure 23J:
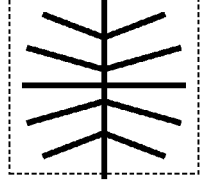
Figure 23K:
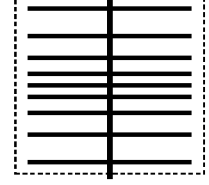
Figure 23L:
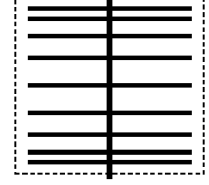
Figure 23M:
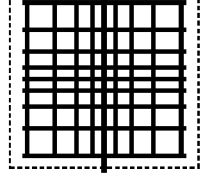
Figure 23N:
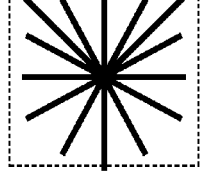
Figure 23O:
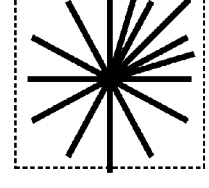
Figure 23P:
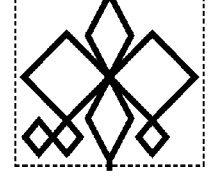

FIGS. 23A to 23P are schematic views showing configuration examples of the linear electrodes 12a. FIG. 23A corresponds to the linear electrodes shown in FIG. 22. In this example, there is a difference in the density between the central part and the peripheral part of the capacitive element 50, and the change amount of the capacitance of the linear electrode at the central part becomes larger than those of the linear electrodes at the peripheral part when the finger comes close to the capacitive element 50. FIG. 23B shows an example where one of the radially-extending linear electrodes shown in FIG. 23A is formed to be thicker than the other of the linear electrodes. Thus, the change amount of the capacitance of the thicker linear electrode can be made larger than those of the other linear electrodes. FIGS. 23C and 23D each show an example where the ring-shaped linear electrode is arranged at the substantially central part and the linear electrodes are formed radially from the substantially central part. Thus, it becomes possible to reduce an intensive arrangement of the linear electrodes at the central part and prevent the occurrence of an area where sensitivity is reduced.

FIGS. 23E to 23H each show an example where the plurality of linear electrodes formed into an annular or rectangular annular shape are combined together to form an aggregate. Thus, it becomes possible to adjust the density of the electrodes and prevent the occurrence of an area where sensitivity is reduced. FIGS. 23I to 23L each show an example where the plurality of linear electrodes arranged in the Y axis direction are combined together to form an aggregate. With an adjustment of the shapes, lengths, pitches, or the like of the linear electrodes, it becomes possible to obtain desired electrode density.

FIGS. 23M to 23P each show an example where the linear electrodes are asymmetrically arranged in the X axis direction or the Y axis direction. Because the linear electrodes are formed such that the density of the electrodes becomes asymmetrical, the detection sensitivity of the sensor 50s can be adjusted for each area. Accordingly, it becomes possible to finely adjust the detection sensitivity of the sensor 50s.

Figure 24:
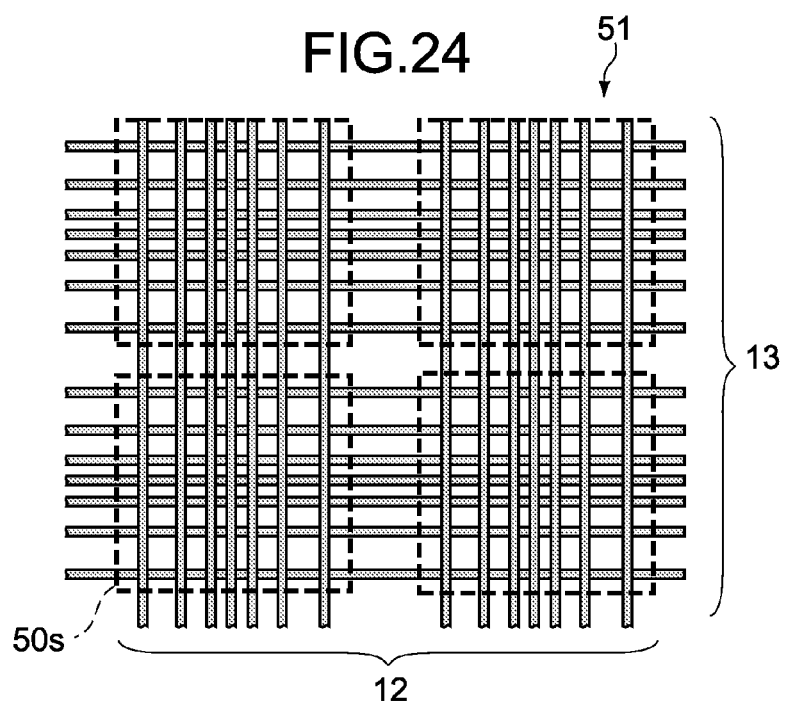
FIG. 24 is a partial plan view schematically showing another configuration example of the electrodes of the sensor matrix.
Figure 25:
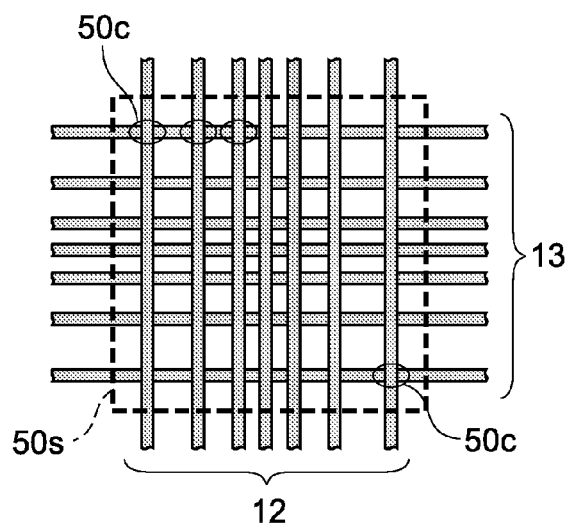
FIG. 25 is a partial enlarged view of the configuration example of the electrodes.

FIG. 24 shows an example of another electrode configuration. FIG. 25 is a partial enlarged view of the electrode configuration shown in FIG. 24. In this example, the X electrodes 12 and the Y electrodes 13 are each constituted of a plurality of linear wiring electrodes, and the linear wiring electrodes are arranged so as to be substantially orthogonal to each other. The individual sensors 50s each include a plurality of intersection parts where the plurality of X electrodes 12 and Y electrodes 13 intersect each other. In other words, the individual sensors 50s are constituted of a plurality of capacitive elements 50c. Thus, the detection sensitivity and the output characteristics with an excellent linearity of the individual sensors 50s can be secured. Note that the sensors 50s may include at least one electrode intersection part only.

The plurality of electrode intersection parts, i.e., the capacitive elements constituting the individual sensors 50s are formed with different density for each area. In the example of FIG. 24, the plurality of X electrodes 12 and Y electrodes 13 are arranged such that the distances between the respective electrodes gradually increase with distance from the centers of the sensors 50s. Thus, the capacitive elements 50c are formed with higher density on the central sides of the sensors 50s and formed with lower density on the peripheral sides thereof. As a result, the sensors 50s can have output characteristics of larger change amounts of the capacitance at areas closer to the central sides thereof.

Note that without being limited to the above example, the sensors 50s may have the capacitive elements with lower density at areas closer to the central sides thereof, for example. With an arbitrary adjustment of the distances between the electrodes, the sensors 50s can have desired output characteristics.

Figure 26:
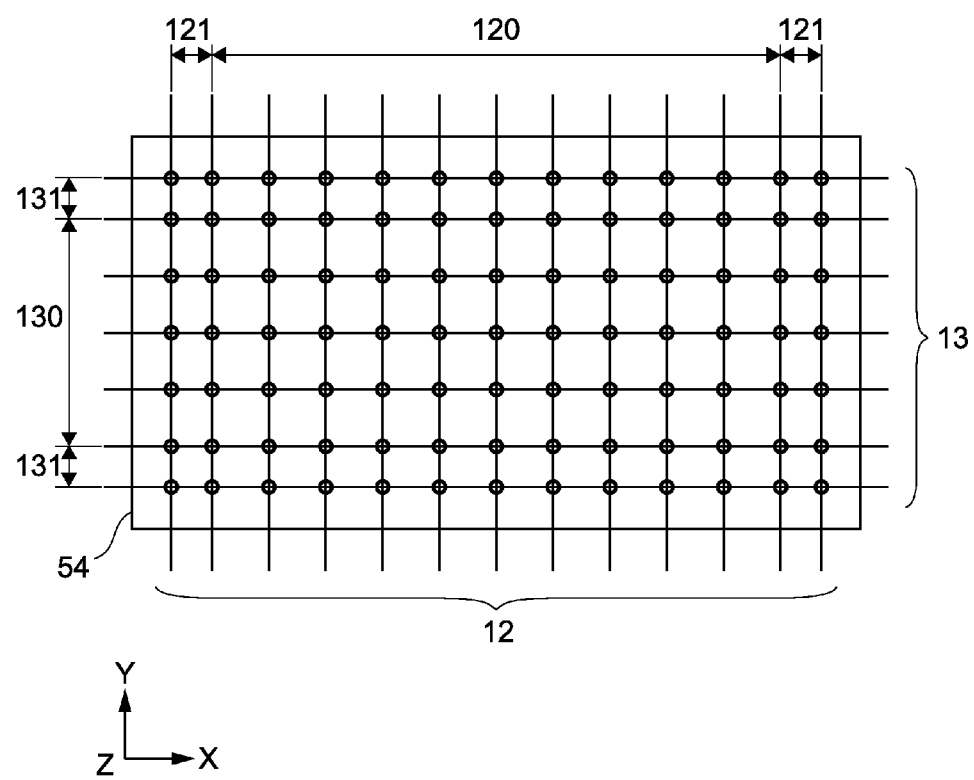
FIG. 26 is a partial plan view schematically showing still another configuration example of the electrodes of the sensor matrix.

FIG. 26 shows an example of still another electrode configuration. In this example also, the X electrodes 12 and the Y electrodes 13 are constituted of a plurality of linear wiring electrodes, and the linear wiring electrodes are arranged so as to be substantially orthogonal to each other. In this example, the plurality of X electrodes 12 and Y electrodes 13 each have areas arranged at partially irregular pitches.

In the sensor unit 500 according to this embodiment, the peripheral side of the input operation part 54 is supported by a housing (not shown) of the input device 5 via, for example, an adhesive tape or the like. Accordingly, the peripheral side of the input operation part 54 is hardly deformed by an input operation compared with the central side of the input operation part 54. As a result, an input position on the peripheral side of the input operation part 54 may be detected with the sensors arranged on an inner peripheral side than the peripheral side of the input position.

In order to eliminate such concern, in the sensor unit 500, the X electrodes 12 and the Y electrodes 13 are arranged such that the distances between the electrodes in areas 121 and 131 on the peripheral sides of the sensor matrix 51 become smaller than the distances between the electrodes in areas 120 and 130 on the central sides thereof. Thus, even if an input operation is performed on peripheral areas of the input operation part 54, it becomes possible to detect an input position with high accuracy because the capacitive elements for detecting the peripheral areas are positioned on sides closer to the central side.

Note that without being limited to the above example where the sensor matrix has the irregular wiring distances on the peripheral sides thereof, the distances may be arbitrarily set according to specifications and desired characteristics of the sensors.

Sixth Embodiment

Figure 27:
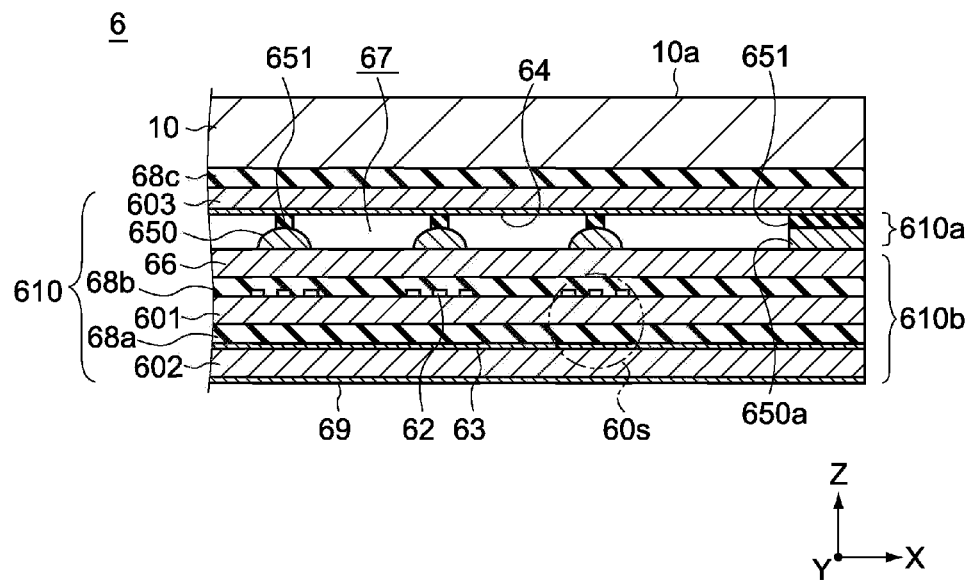
FIG. 27 is a cross-sectional view showing an input device according to a sixth embodiment of the present disclosure.

FIG. 27 is a partial cross-sectional view of an input device 6 according to a sixth embodiment of the present disclosure. The structure of the input device 6 excluding a sensor unit 610 according to this embodiment is the same as the first embodiment, so the description will be omitted.

The sensor unit 610 according to this embodiment includes a substrate 610b having a plurality of capacitive elements 60s, a conductive layer 64, and a support layer 610a.

The substrate 610b includes X electrodes 62, a first base material 601 that supports the X electrodes 62, Y electrodes 63, and a second base material 602 that supports the Y electrodes 63. The X electrodes 62 are composed of a plurality of wiring electrodes arranged in the X-axis direction and formed on a surface of the first base material 601 (upper surface in the figure). In this embodiment, at least intersection areas with the Y electrodes 63 are composed of the arbitrary number of wiring electrode groups arranged in the X-axis direction at a predetermined pitch. In the same way, the Y electrodes 63 are also composed of a plurality of wiring electrodes arranged in the Y-axis direction and formed on a surface of the second base material 602 (upper surface in the figure). In this embodiment, at least intersection areas with the X electrodes 63 are composed of the arbitrary number of wiring electrode groups arranged in the Y-axis direction at a predetermined pitch.

The first base material 601 is layered on the second base material 602 with an adhesive layer 68a intervened therebetween. The X electrode 62 and the Y electrode 63 are each formed of a metal material such as Ag and Cu, a conductive paste including those, or a conductive oxide such as an ITO (indium tin oxide). The first and second base materials 601 and 602 are each formed of an electrically insulating resin sheet such as PET, PEN, PI, and PC.

The plurality of capacitive elements 60s are formed as capacitive elements as a mutual capacitance system formed on intersection areas of the X electrodes 62 and the Y electrodes 63 and each have a predetermined capacitance in accordance with a facing area, a facing distance, and dielectric constants of the first base material 601 and the adhesive layer 68a. In this embodiment, the plurality of capacitive elements 60s are arranged in a matrix pattern in a plane parallel to the XY plane.

The substrate 610b further includes an insulating layer 66 and a shield layer 69.

The insulating layer 66 is formed of an insulating resin film such as PET and PEN. The insulating layer 66 is provided between the X electrode 62 and the support layer 610a and covers the X electrode 62 through the adhesive layer 68b. As a result, it is possible to prevent an electrical contact between the conductive layer 64 and the first base material 601 (X electrode 62). The adhesive layer 68b is formed to have a thickness so as to cover the X electrode 62 disposed on the surface of the first base material 601 and bonds the first base material 601 and the insulating layer 66 to each other. It should be noted that the insulating layer 66 is not limited to the example in which the layer is formed of the resin film but may be an insulating film applied on the first base material 601.

The shield layer 69 is formed of a metal layer such as copper foil formed on a back surface (lower surface in the figure) of the second base material 602. The shield layer 69 is used to shield an electromagnetic noise that enters the capacitive elements 60s from the back surface side of the sensor unit 6 and is formed in a solid form, a mesh form, or a lattice form, for example. The shield layer 69 is connected to a ground potential, thereby increasing the shielding effect. It should be noted that the shield layer 69 may not be provided as necessary.

The conductive layer 64 is supported by a third base material 603. The third base material 603 is formed of a resin sheet in the same way as the first and second base materials 601 and 602 and is bonded to the back surface of flexible display 10 with the adhesive layer 68c intervened therebetween.

The conductive layer 64 corresponds to the reference electrode described in the first embodiment and is bonded to the back surface of the flexible display 10 opposed to the substrate 11b with the adhesive layer intervened therebetween. The conductive layer 64 is formed in a solid form, a mesh form, or a lattice form, for example, and is connected to the ground potential.

The conductive layer 64 is disposed so as to be opposed to the capacitive elements 60s (substrate 11b) with the support layer 610a intervened therebetween. The conductive layer 64 has flexibility and receives a pressure force input to an operation surface 10a, which is the surface of the flexible display 10 to be partially deformable toward the capacitive elements 60s (substrate 11b) along with the flexible display 10.

The support layer 610a is disposed between the capacitive elements 60s (substrate 11b) and the conductive layer 64. The support layer 610a includes a plurality of structures 650 that support the conductive layer 64 and a space 67 that is formed between the structures 650.

The space 67 is formed so that a distance between the capacitive elements 60s (substrate 11b) and the conductive layer 64 can be partially changed. As a result, out of the plurality of capacitive elements 60s, the capacitance (intersection capacitance) of a capacitive element 60s that is close to a deformation area of the conductive layer 64 is changed. Therefore, the change in the capacitance makes it possible to electrostatically detect an input position and a pressure amount to the operation surface 10a.

Typically, the space 67 is an air layer but may be filled with another gas (for example, inert gas) other than air. Further, the spaces 67 are communicated with each other around the plurality of structures 650 but may be sectioned into a plurality of spaces depending on the shape of the structures 650 (in the case where the structures 650 are formed into the lattice form, for example).

In this embodiment, the plurality of structures 650 are formed of an elastic material capable of being elastically deformed in the Z-axis direction. As such a material, a rubber material such as silicon rubber and urethane rubber or a buffer material such as a sponge can be applied as appropriate. The plurality of structure 650 are each formed into a semispherical shape or a dome shape which is protruded toward the conductive layer 64 side but are not limited to those shapes. A geometric shape such as a rectangular parallelepiped shape and a cylindrical shape may be used. Further, the plurality of structures 650 is not limited to be formed in a dotted form but may be formed linearly in the X-axis direction or the Y-axis direction, for example.

The support layer 610a further includes a bonding part 651. The bonding part 651 is disposed between the plurality of structures 650 and the conductive layer 64 and bonds the plurality of structures 650 to the conductive layer 64. With this structure, the structures 650 are each caused to cohere with the conductive layer 64, with the result that it is possible to prevent a positional displacement and separation between those. Further, the bonding part 651 is formed only on the position immediately above the structure 650, so in the bonding step for the support layer 610a and the conductive layer 64, it is possible to prevent sticking between the conductive layer 64 and the insulating layer 66. As a bonding material that forms the bonding part 651, an adhesive or the like is used.

The plurality of structures 650 are formed on the surface of the insulating layer 66 with the use of an appropriate printing technique such as a screen printing method, a pad printing method, or a transfer method, for example. At this time, on a peripheral portion of the surface of the insulating layer 66, a frame body 650a is formed by using the material that forms the structures 650. At the time when the bonding part 651 is formed, the bonding material that forms the bonding part 651 is also applied to the surface of the frame body 650a. As a result, the frame body 650a is integrally bonded to the conductive layer 54.

The frame body 650a may be continuously formed along the periphery of the insulating layer 66 or may be intermittently formed. In the case where the frame body 650a is continuously formed along the periphery of the insulating layer 66, the space 67 can be separated from the vicinity of the sensor unit 610, so it is possible to shut off entering of water or the like into the space 67. On the other hand, in the case where the frame body 650a is intermittently formed along the periphery of the insulating layer 66, the space 67 can be communicated with the vicinity of the sensor unit 610, and therefore it is possible to avoid generation of a pressure difference between the inside and the outside of the frame body 650a.

In addition, in this embodiment, the plurality of structures 650 are disposed immediately above the capacitive elements 60s. That is, the plurality of structures 650 are arranged in at least a part of the intersection areas of the X electrodes 62 and the Y electrodes 63. With this structure, for an approximately entire surface of the operation surface 10a, it is possible to perform isotropic pressure detection with a sensitivity difference reduced.

That is, in the sensor apparatus 610 according to this embodiment, the structure 650 is formed of the elastic material. Therefore, in the case where a pressing operation is input on a position immediately above any one of the structures 650, the structure 650 is elastically deformed, which reduces a relative distance between an area of the conductive layer 64 corresponding to the pressing position and the capacitive element 60s opposed thereto. Thus, even in the case where the deformation amount of the structure 650 that is elastically deformed is small, it is possible to detect the change in the capacitance of the capacitive element 60s corresponding to the input position.

On the other hand, in the case where the pressing operation is input between adjacent structures 650, the structure 650 is not provided immediately below the input position, so an area of the conductive layer 64 corresponding to the pressing position generates a larger deformation amount as compared to the case where the position immediately above the structure 650 is pressed. Therefore, the deformation area of the conductive layer 64 is easily capacitively coupled with the capacitive element 60 therearound, with the result that it is possible to detect the change in the capacitance of the capacitive element 60s.

As described above, in this embodiment, it is also possible to obtain the same operation effect as the first embodiment. Further, by the sensor unit 610 according to this embodiment, the operation surface 10a with a reduced input sensitivity difference can be achieved, with the result that it is possible to provide an excellent input operation feeling in the case where a flexible display 10 is used as the input operation part. Further, it is possible to detect XY coordinates of the input position by centroid computation with high accuracy.

It should be noted that in this embodiment, the insulating layer 66 also has a function as a second structure in the sensor unit 11 according to the first embodiment. In other words, the sensor unit 610 according to this embodiment corresponds to the structure in which the first structure 15 and the second structure 16 are integrally formed in the sensor unit 11 shown in FIG. 1.

Modified Example 1 of Sixth Embodiment

Figure 28:
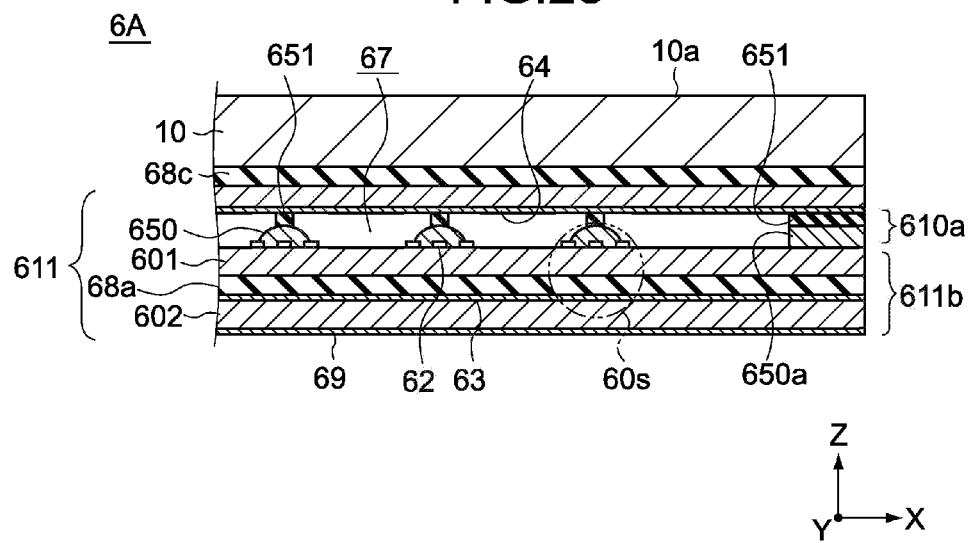
FIG. 28 is a cross-sectional view showing an input device according to a modified example shown in FIG. 27.

FIG. 28 is a partial cross-sectional view showing a modified example of the sensor unit according to the sixth embodiment. It should be noted that, in FIG. 28, parts corresponding to FIG. 27 are denoted by the same reference symbols, and explanations thereof will be omitted.

In an input device 6A (sensor unit 611) according to this modified example, the structure of a substrate 611b is different from the substrate 610b of the sensor unit 610 shown in FIG. 27. In the substrate 611b, a plurality of structures 650 are directly provided on the first base material 601 that supports the X electrodes 62. That is, the sensor unit 61A according to this embodiment has the structure in which the insulating layer 66 in the sensor unit 6 shown in FIG. 27 is omitted.

In this modified example, it is also possible to obtain the same operation effect as the sixth embodiment. According to this modified example, it is possible to reduce the facing distance between the conductive layer 64 and the capacitive elements 60s, so the sensitivity of the pressing operation can be increased. Further, according to this modified example, it is possible to thin the configuration of the substrate 611b, so a reduction in thickness of the sensor unit can be achieved.

Modified Example 2 of Sixth Embodiment

Figure 29:
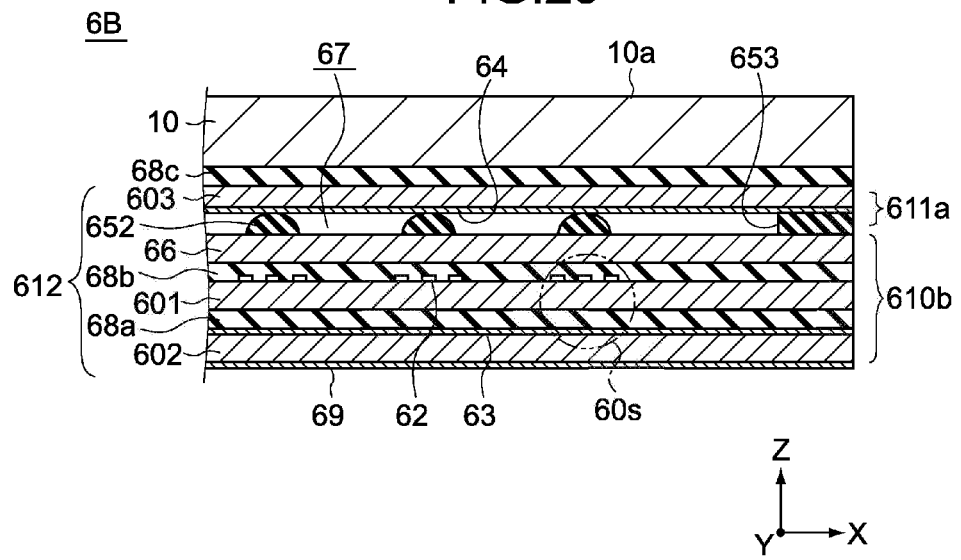
FIG. 29 is a cross-sectional view showing an input device according to a modified example shown in FIG. 27.

FIG. 29 is a partial cross-sectional view showing another modified example of the sensor unit according to the sixth embodiment. It should be noted that in FIG. 29, parts corresponding to FIG. 27 are denoted by the same reference symbols, and explanations thereof will be omitted.

In an input device 6B (sensor unit 612) according to this modified example, the structure of a support layer 611a is different from the support layer 610a of the sensor unit 610 shown in FIG. 27. That is, in the support layer 611a according to this embodiment, a plurality of structures 652 are made of a bonding material including an adhesive or the like and have a function for forming the space 67 in the support layer 611a and a function for bonding the insulating layer 66 (substrate 610b) and the conductive layer 64 with each other. The plurality of structures 652 may be formed into a semispherical shape or a dome shape which is protruded toward the conductive layer 64 side.

It should be noted that in the sensor unit 6B according to this modified example, a frame body 653 formed around the insulating layer 66 is also formed of a single layer of the bonding material that forms the structures 652.

In this modified example, it is also possible to obtain the same operation effect as the sixth embodiment described above. According to this modified example, it is possible to form the structure 652 with the single layer, so the support layer 611a is easily manufactured. As a result, it is possible to increase the productivity and reduce the material cost.

Figure 30:
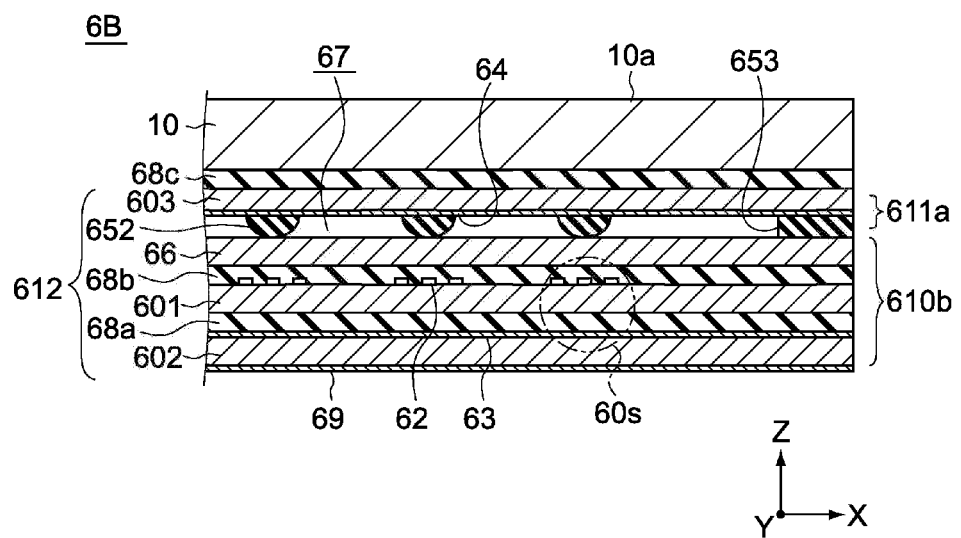
FIG. 30 is a cross-sectional view showing an input device according to a modified example shown in FIG. 29.

On the other hand, as shown in FIG. 30, the plurality of structures 652 may be formed into a semispherical shape or a dome shape which is protruded toward the substrate 610b side. With this structure, at the time when a position between the structures 652 is pressed, the deformation area of the conductive layer 64 is prevented from being bonded to the curve surface-shaped periphery of the structures 652. Therefore, when the pressing operation is released, the deformation area of the conductive layer 64 can be returned to the original position appropriately and promptly.

Figure 31:
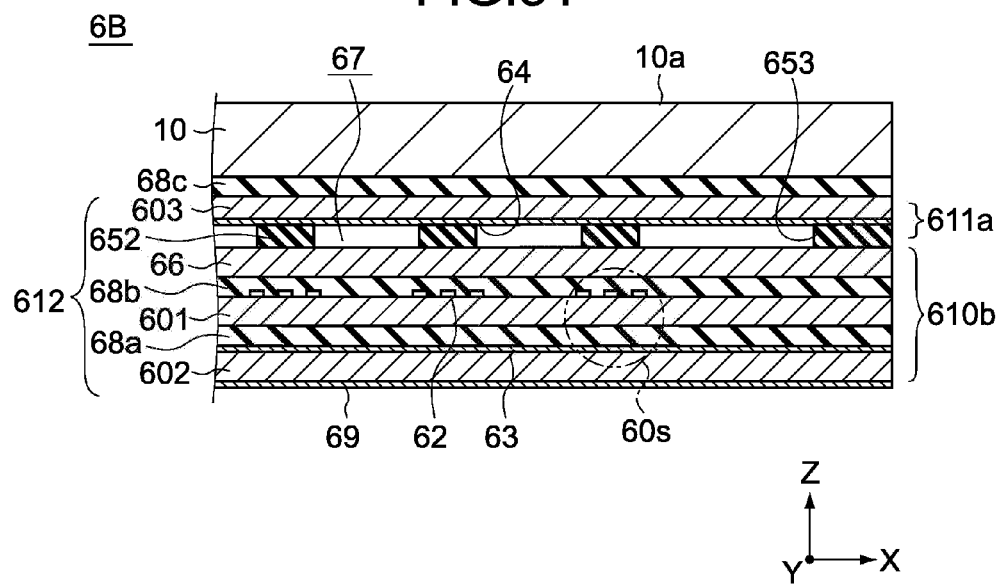
FIG. 31 is a cross-sectional view showing an input device according to a modified example shown in FIG. 29.

Alternatively, as shown in FIG. 31, the plurality of structures 652 may be formed into a columnar shape or a prism shape. In this case, the plurality of structures 652 can be formed by a cohesive sheet (double-faced sheet) which is punched out into a predetermined shape having a predetermined size. With this structure, it is also possible to obtain the same operation effect as the structure shown in FIG. 30.

Modified Example 3 of Sixth Embodiment

Figure 32:
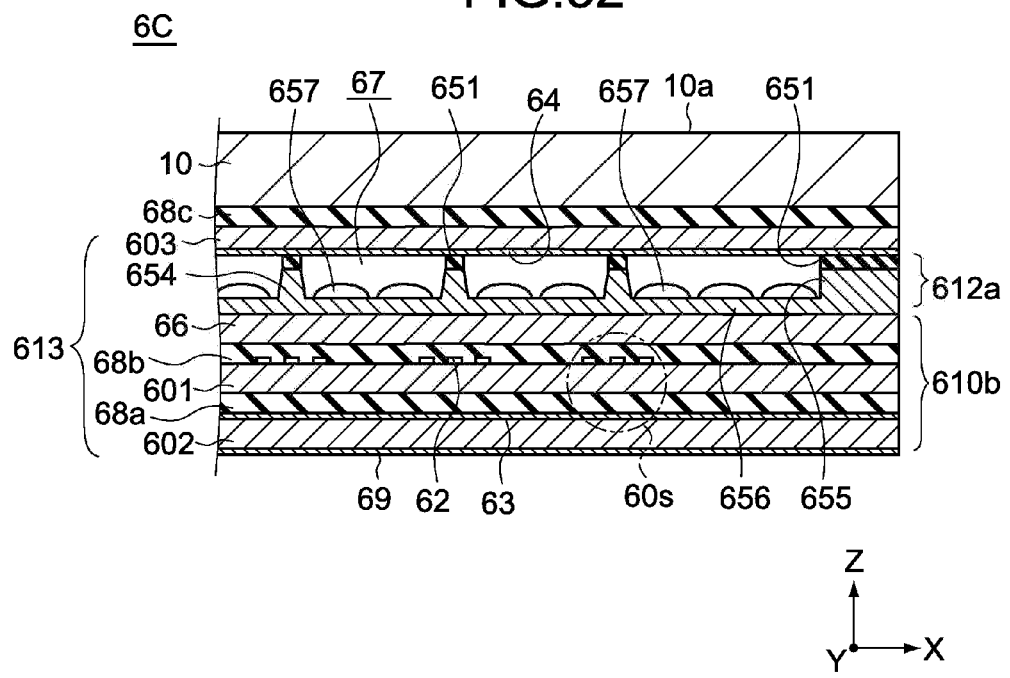
FIG. 32 is a cross-sectional view showing an input device according to a modified example shown in FIG. 27.
Figure 33:
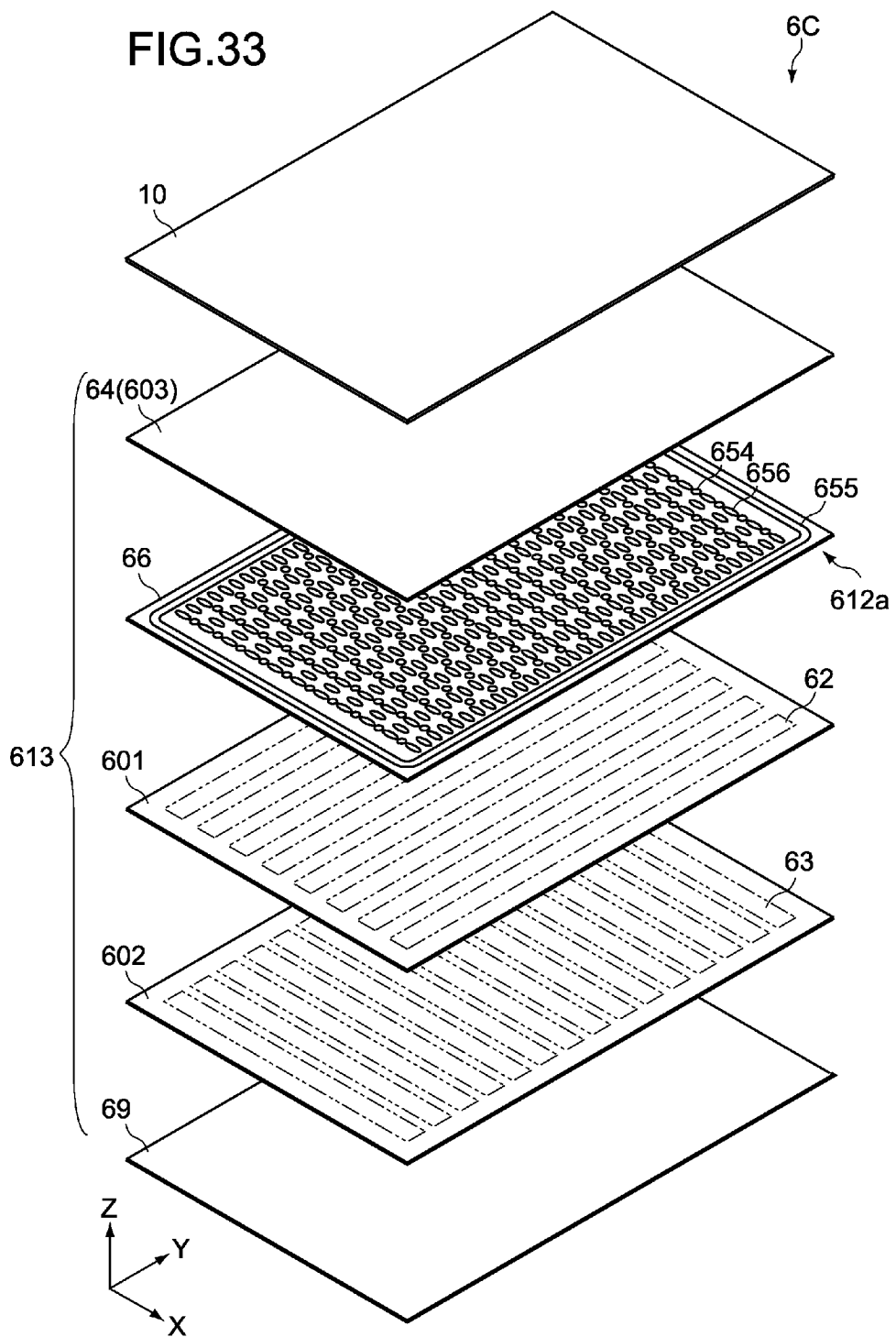
FIG. 33 is an exploded perspective view showing a main part of the input device according to the modified example shown in FIG. 32.

FIG. 32 is a partial cross-sectional view showing another modified example of the sensor unit according to the sixth embodiment. FIG. 33 is a schematic exploded perspective view of an input device 6C. It should be noted that in FIGS. 32 and 33, parts corresponding to FIG. 27 are denoted by the same reference symbols, and explanations thereof will be omitted.

In the input device 6C (sensor unit 613) according to this modified example, the structure of a support layer 612a is different from the support layer 610a of the sensor unit 610. Specifically, the support layer 612a according to this modified example has a plurality of structures 654, a frame body 655, and a base part 656, and the plurality of structures 654, the frame body 655, and the base part 656 are integrally formed of the same resin material (for example, UV curing resin) by a transfer method or the like.

The plurality of structures 654 has a columnar shape like the first structure 15 in the first embodiment. The frame body 655 is formed continuously or intermittently along the periphery of the insulating layer 66. The base part 656 is formed on the surface of the insulating layer 66 and functions as a base layer of the frame body 655 and the plurality of structures 654. Further, the plurality of structures 654 and the frame body 655 are bonded to the conductive layer 64 with the bonding part 651.

The support layer 612a in this modified example further has a regulation part 657 disposed between the structures 654. The regulation part 657 is disposed on the base part 656 opposed to the conductive layer 64 with the space 67 sandwiched therebetween and prevents the conductive layer 64 from being in contact with the base part 656. With this structure, even after the base part 656 (structure 654 and frame body 655) is cured like a UV curing resin and even in the case where the base part 656 is formed of a material having a tack (cohesive) property of a predetermined degree or more, it is possible to prevent the conductive layer 64 deformed at the time of the pressing operation from being bonded to the base part 656 and to secure an appropriate input release operation.

In this case, the regulation part 657 is formed of a material having a lower tack property than the material that forms the base part 656. The shape and size of the regulation part 657 and the number thereof are not particularly limited. In this modified example, one or more regulation parts 657 are provided in each gap between the structures 654 adjacent in the X-axis direction. The shape of the regulation part 657 is not particularly limited as long as the regulation part is lower than the structures 654 and the frame body 655, and the regulation part 657 is formed into a semispherical shape, a dome shape, another curved shape protruded toward the conductive layer 64 side, or a rectangular parallelepiped shape.

Modified Example 4 of Sixth Embodiment

FIG. 34 is a partial cross-sectional view showing another modified example of the sensor unit according to the sixth embodiment. It should be noted that in FIG. 34, parts corresponding to FIG. 27 and FIG. 32 are denoted by the same reference symbols, and explanations thereof will be omitted.

An input device 6D (sensor unit 614) according to this modified example has the substrate 611b having the same structure as the substrate shown in FIG. 28. That is, the sensor unit 614 according to this embodiment has the structure in which the insulating layer 66 is omitted in the sensor unit 610 shown in FIG. 27, the base part 656 is formed on the first base material 601 that supports the X electrodes 62, and the plurality of structures 654 are provided immediately above the capacitive elements 60s.

In this modified example, it is also possible to obtain the same operation effect as the sixth embodiment described above. According to this modified example, it is possible to reduce the facing distance between the conductive layer 64 and the capacitive elements 60s, so the sensitivity of the pressing operation can be increased. Further, according to this modified example, it is possible to thin the configuration of the substrate 611b, so the reduction in thickness of the sensor unit can be achieved.

Seventh Embodiment

FIG. 35 is a partial cross-sectional view showing an input device according to a seventh embodiment of the present disclosure. It should be noted that in FIG. 35, parts corresponding to the sixth embodiment are denoted by the same reference symbols, and explanations thereof will be omitted.

A sensor unit 710 in this embodiment is different from the sensor unit in the sixth embodiment in terms of the configuration of a substrate 710b. Specifically, in the substrate 710b in this embodiment, the plurality of X electrodes 62 are arranged so as to be disposed between the plurality of structures 650. That is, the plurality of structures 650 are arranged in an area other than the intersection area of the plurality of X electrodes 62 and the plurality of Y electrodes 63. It should be noted that the arrangement method of the X electrodes 62 can be applied to the structural examples shown in FIGS. 28 to 34 in addition to the example of FIG. 35.

Further, the input device 7 in this embodiment is different from the input device in the sixth embodiment in that the input device 7 is provided with a flexible keyboard 20 instead of the flexible display 10. The flexible keyboard 20 is bonded to the surface of the third base material 603 that supports the conductive layer 64.

Figure 36:
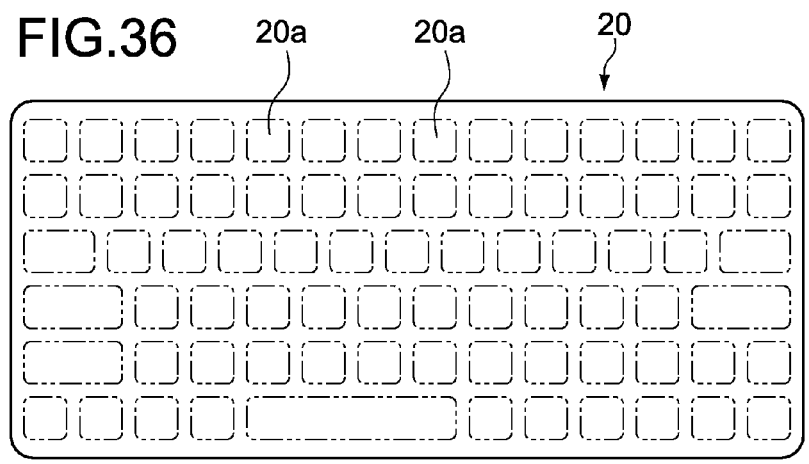
FIG. 36 is a plan view of a flexible keyboard in the input device shown in FIG. 35.

FIG. 36 is a plan view showing the entire configuration of the flexible keyboard 20. The flexible keyboard 20 is formed of an insulating plastic sheet, for example, but may be formed of a metal sheet. In this case where the flexible keyboard is formed of the metal sheet, the conductive layer 64 can be omitted. On the surface of the flexible keyboard 20, a plurality of key areas 20a are arranged. The shape of the flexible keyboard 20 is not limited to a flat sheet shape. For example, the key areas 20a may be formed to have a predetermined uneven surface.

The plurality of key areas 20a are not limited to have the same size and shape may have different sizes depending on kinds of keys. On the key areas 20a, appropriate key indications may be provided. The key indications may indicate the kinds of the keys, respective key positions (outlines), or both of those.

Figure 37:
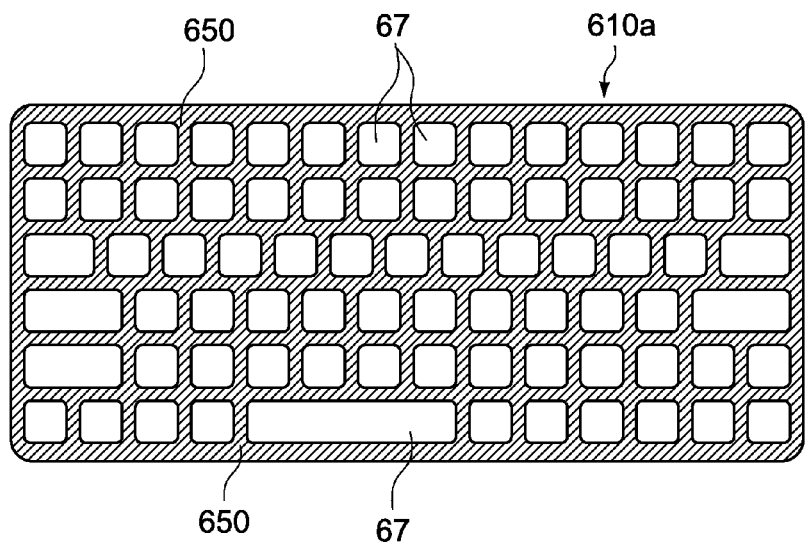
FIG. 37 is a plan view of a support layer in the input device shown in FIG. 35.

FIG. 37 is a schematic plan view showing the support layer 610a that forms the sensor unit 710. The support layer 610a has the plurality of structures 650 and the space 67 that is formed between the structures 650. In this embodiment, the plurality of structures 650 are made of a material having relatively high rigidity such as epoxy-based resin, but may be made of an elastic material having relatively low rigidity such as urethane-based resin. Alternatively, the plurality of structures 650 may be a continuous body including the base part and the frame body, which is made of a UV curing resin as shown in FIG. 32. On the other hand, the space 67 is formed to have a shape and size corresponding to the key areas 20a of the flexible keyboard 20. On the other hand, the plurality of structures 650 are provided between the key areas 20a (in the area shown as shaded area in FIG. 37) of the flexible keyboard 20.

Figure 38:
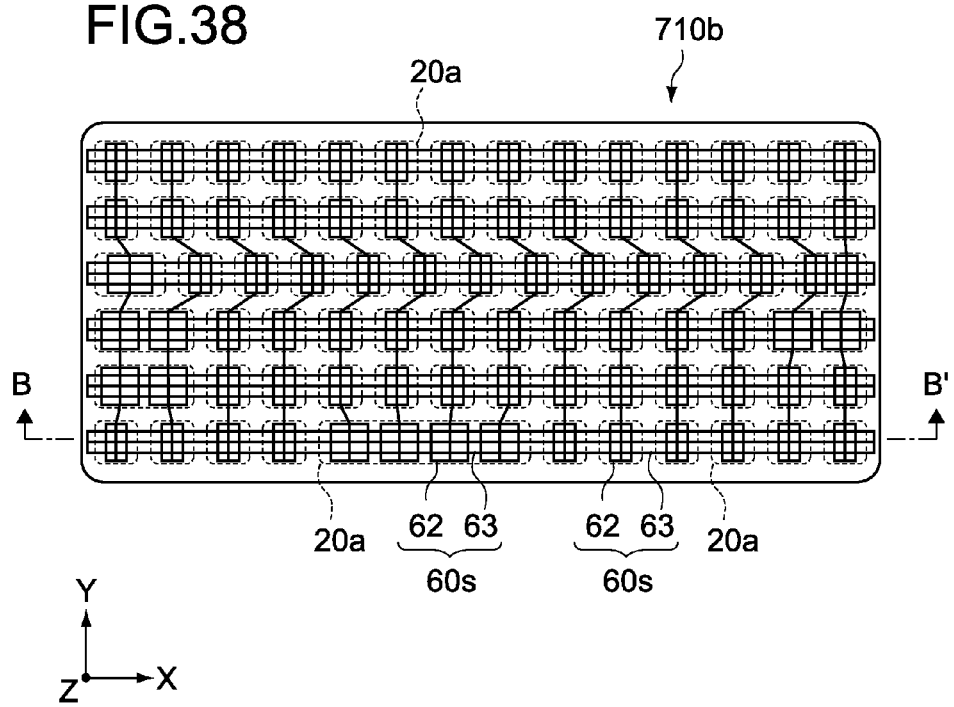
FIG. 38 is a plan view of a substrate in the input device shown in FIG. 35.
Figure 39:
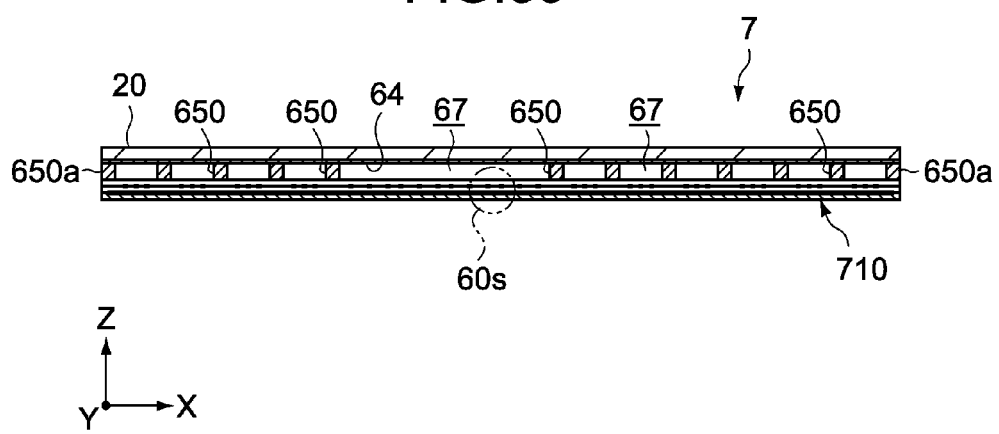
FIG. 39 is a cross-sectional view of the input device taken along the line B-B' of FIG. 38.

FIG. 38 is a schematic plan view of the substrate 710b that forms the sensor unit 710. FIG. 39 is a cross-sectional view of the input device 7 taken along the line B-B' of FIG. 38. As described above, the plurality of structures 650 are arranged in the areas other than the intersection areas of the plurality of X electrodes 62 and the plurality of Y electrodes 63, so the capacitive elements 60s are disposed on positions opposed to the key areas 20a (space 67) in the Z-axis direction. In particular, in this embodiment, the X electrodes 62 are wired with a single line between the key areas 20a and wired by being separated into multiple lines in the key areas 20a. With this structure, the number of capacitive elements 60s opposed to the key areas 20a is increased, with the result that the detection sensitivity of the key input operation can be improved.

In the input device 7 in this embodiment, one or more capacitive elements 60s are disposed so as to be opposed to the key areas 20a of the flexible keyboard 20, with the result that it is possible to detect the input position with high sensitivity.

For example, FIG. 40 is a schematic diagram showing a relationship between the input operation to the input device 7 according to this embodiment and the output of the capacitive elements 60s. By the input device 7 of this embodiment, a significant change in capacitance is generated between the capacitive element 60s disposed below the key area 20a and other capacitive elements 60s adjacent thereto, so it is possible to detect the input key position with high accuracy, and thus the input device can be desirably used as an input device such as a keyboard. In this case, the plurality of structures 650 are made of the material having relatively high rigidity, thereby making it possible to further reduce the change in capacitance of other capacitive elements 60s adjacent thereto.

On the other hand, FIG. 41 shown as a comparison is a schematic diagram showing a relationship between the input operation to the input device 6 according to the sixth embodiment and the output of the capacitive elements 60s. As shown in FIG. 41, in the case where the capacitive elements 60s are disposed so as to be opposed to the structures 650, multiple capacitive elements 60s in the vicinity of the input position causes the change in capacitance. This example is particularly desirable for the case where the pressing position (XY coordinates) of the flexible display 20 is specified by centroid computation as in the first embodiment.

The embodiments of the present disclosure are described above. However, the present disclosure is not limited to the above embodiments and may be, of course, modified in various ways without departing from the gist of the present disclosure.

For example, the sensor unit can constitute a detection unit such as a pressure sensor by itself without the flexible display. A sheet formed of a resin or the like can be bonded to the sensor unit instead of the flexible display. Because the sensor unit according to the embodiments of the present disclosure has high sensitivity, it is capable of supporting various sheets.

In addition, the embodiments of the present disclosure are applicable to information input devices such as touch pads, mice, and keyboards and information display apparatuses such as TV sets and digital signages. Moreover, the embodiments of the present disclosure are also applicable to information processing devices such as mobile phones, smart phones, notebook PCs, and tablet PCs.

Further, in the above embodiments, the sensor unit having the plurality of capacitive elements arranged in the XY plane is used as the example but is not limited to this. The present disclosure can be applied to a sensor unit having a single capacitive element. In this case, the sensor unit can be configured as a pressing switch such as a game controller.

Further, in the first embodiment, the reference electrode 14 is disposed between the flexible display 10 and the support layer 11a, for example. However, the reference electrode 14 may be incorporated in the flexible display 10. In this case, the reference electrode may be provided to the flexible display 10 separately or may be formed of a conductive layer (for example, scanning electrode of a TFT (thin-film transistor)) incorporated in the flexible display 10.

Note that the present disclosure may employ the following configurations.

(1) A sensor unit comprising:
a first substrate;
first and second electrodes;
an input portion disposed so that a gap exists between the substrate and the input portion;
a plurality of first structures disposed in the gap and extending at least partially between the first substrate and the input portion; and
a second insulating structure disposed on a side of the first structures that is away from the input portion, or between adjacent first structures;
wherein the sensor unit is configured to detect a change in capacitance between the first and second electrodes upon a change in position of the input portion relative to the first substrate.

(2) The sensor unit according to (1), wherein the first structures are deformable.

(3) The sensor unit according to (1), wherein the first electrodes intersect with the second electrodes to form a plurality of capacitive elements.

(4) The sensor unit according to (1), further comprising a reference electrode spaced a distance apart from the first electrodes on a side of the input portion facing the gap.

(5) The sensor unit according to (4), wherein the sensor unit is configured such that when the reference electrode is moved closer to the first substrate a capacitance between the first electrodes and the reference electrode increases, and the capacitance between the first electrodes and the second electrodes decreases.

(6) The sensor unit according to (1), further comprising a second substrate, wherein the second electrodes are formed on the second substrate, the first substrate is formed on the second electrodes, and the first electrodes are formed on the first substrate.

(7) The sensor unit according to (1), wherein the second insulating structure is a layer disposed between the first structures and the first substrate.

(8) The sensor unit according to (7), wherein the first structures are formed directly on the second insulating structure.

(9) The sensor unit according to (7),
wherein the first structures are formed in a shape selected from the group consisting of a semispherical shape, a dome shape, a rectangular parallelepiped shape and a cylindrical shape.

(10) The sensor unit according to (9), further comprising bonding portions formed in a second gap between tops of the first structures and a reference electrode formed on a side of the input portion facing the gap.

(11) The sensor unit according to (1), wherein the second electrodes are formed on the second substrate, and wherein the second insulating structure is formed on the second electrodes.

(12) The sensor unit according to (1), wherein the first electrodes are formed on the first substrate.

(13) The sensor unit according to (12), wherein the first structures are directly formed on the first electrodes.

(14) The sensor unit according to (1), further comprising a frame body formed continuously or intermittently along a periphery of the second insulating structure.

(15) The sensor unit according to (14),
wherein the second insulating structure is formed beneath the plurality of first structures, and
wherein the frame body and the second insulating structure and are integrally formed.

(16) The sensor unit according to (1), wherein the first structures are made of a bonding material and extend across the gap to bond the first substrate to a reference electrode formed on a side of the input portion facing the gap.

(17) The sensor unit according to (16), wherein the first structures are formed in a semispherical or dome shape.

(18) The sensor unit according to (17), wherein the semispherical shape or the dome shape of the first structures protrude toward the first substrate side.

(19) The sensor unit according to (17), wherein the semispherical shape or the dome shape of the first structures protrude toward the reference electrode side.

(20) The sensor unit according to (16), wherein the first structures are formed in a in a rectangular parallelepiped shape or a cylindrical shape.

(21) The sensor unit according to (1),
wherein the first electrodes intersect with the second electrodes to form a plurality of intersection areas, and
wherein the first structures are arranged in areas other than the intersection areas.

(22) The sensor unit according to (1), wherein the first electrodes are disposed between adjacent first structures.

(23) The sensor unit according to (1), further comprising at least one regulation part disposed between adjacent first structures, and disposed between the first substrate and the input portion.

(24) A method of detecting a change in capacitance in a sensor unit including a first substrate, first and second electrodes, an input portion disposed so that a gap exists between the substrate and the input portion, and a plurality of first structures disposed in the gap and extending at least partially between the first substrate and the input portion, and a second insulating structure disposed on a side of the first structures that is away from the input portion, or between adjacent first structures, the method comprising:
changing a position of the input portion relative to the first substrate; and
detecting a change in capacitance between the first and second electrodes based upon the change in position of the input portion relative to the first substrate.

(25) An electronic device comprising:
a sensor unit including
a first substrate,
first and second electrodes,
an input portion disposed so that a gap exists between the substrate and the input portion,
a plurality of first structures disposed in the gap and extending at least partially between the first substrate and the input portion, and
a second insulating structure disposed on a side of the first structures that is away from the input portion, or between adjacent first structures; and
a controller including
a detection part configured to detect a change in the capacitance between the first and second electrodes upon a change in position of the input portion relative to the first substrate, and
a signal generation part configured to generate an operation signal based on a detection result of the detection part.

Note that the present disclosure may also employ the following configurations.

(1) A sensor unit, including:
a first surface and a second surface facing each other;
a support layer having first structures and spaces,
the first structures each being partially arranged between the first surface and the second surface and each having a first height,
the spaces each being formed between the first surface and the second surface; and
capacitive elements each having a first electrode and a second electrode and each configured to cause a change in capacitance between the first electrode and the second electrode depending on a change in a distance between the first surface and the second surface facing each other via corresponding one of the spaces,
the first electrode being arranged on one of the first surface and the second surface,
the second electrode being arranged facing the first electrode.

(2) The sensor unit according to (1), in which
the support layer further has second structures each arranged in corresponding one of the spaces and each having a second height lower than the first height.

(3) The sensor unit according to (2), in which
the second structures are formed on at least one of the first surface and the second surface.

(4) The sensor unit according to any one of (1) to (3), further including:
a third surface arranged on a side opposite to the first surface with respect to the second surface and facing the second surface; and
a reference electrode formed on the first surface, in which
the first electrodes are formed on the second surface, and
the second electrodes are formed on the third surface.

(5) The sensor unit according to any one of (1) to (3), in which
the first electrodes are formed on the first surface, and
the second electrodes are formed on the second surface.

(6) The sensor unit according to any one of (1) to (3), in which
the first electrodes and the second electrodes are formed on the first surface.

(7) The sensor unit according to any one of (1) to (3), further including
a reference electrode formed on the first surface, in which
the first electrodes and the second electrodes are formed on the second surface.

(8) The sensor unit according to any one of (1) to (7), in which
the first structures include a plurality of column-shaped bodies, and
the plurality of column-shaped bodies are arranged regularly.

(9) The sensor unit according to (8), in which
the plurality of column-shaped bodies are each formed into a shape whose cross section parallel to the first surface is one of a circle and a polygon.

(10) A sensor unit, including:
a substrate including a plurality of first electrodes and a plurality of second electrodes facing the plurality of first electrodes;
a conductive layer facing the plurality of first electrodes and having flexibility;
a support layer including a plurality of structures that are arranged between the substrate and the conductive layer and support the conductive layer, and a space formed between the plurality of structures and capable of partially changing a distance between the substrate and the conductive layer.

(11) The sensor unit according to (10), in which
the substrate further includes an insulating layer provided between the plurality of first electrodes and the support layer.

(12) The sensor unit according to (10) or (11), in which
the plurality of structures are arranged in at least a part of intersection areas of the plurality of first electrodes and the plurality of second electrodes.

(13) The sensor unit according to (12), in which
the plurality of structures are formed of an elastic material.

(14) The sensor unit according to (10) or (11), in which
the plurality of structures are arranged in an area other than intersection areas of the plurality of first electrodes and the plurality of second electrodes.

(15) The sensor unit according to any one of (10) to (14), in which
the substrate further includes a base material that supports the plurality of first electrodes.

(16) The sensor unit according to any one of (10) to (15), in which
the support layer further includes a bonding part disposed between the plurality of structures and the conductive layer and configured to bond the plurality of structures to the conductive layer.

(17) The sensor unit according to any one of (10) to (16), in which
the plurality of structures are formed of a bonding material that bonds the substrate and the conductive layer to each other.

(18) The sensor unit according to any one of (10) to (17), in which
the support layer further includes
  a base part configured to support the plurality of structures and facing the conductive layer with the space intervened therebetween, and
  a regulation part disposed on the base part and configured to prevent the conductive layer from being in contact with the base part.

(19) An input device, including:
a first surface and a second surface facing each other;
a support layer having first structures and spaces,
  the first structures each being partially arranged between the first surface and the second surface and each having a first height,
  the spaces each being formed between the first surface and the second surface;
capacitive elements each having a first electrode and a second electrode and each configured to cause a change in capacitance between the first electrode and the second electrode depending on a change in a distance between the first surface and the second surface facing each other via corresponding one of the spaces,
  the first electrode being arranged on one of the first surface and the second surface,
  the second electrode being arranged facing the first electrode; and
a controller having a detection part configured to detect the change in the capacitance and a signal generation part configured to generate an operation signal based on a detection result of the detection part.

(20) An input device, including:
one or more sensors each having
  a first surface and a second surface facing each other,
  a support layer having first structures and spaces,
    the first structures each being partially arranged between the first surface and the second surface and each having a first height,
    the spaces each being formed between the first surface and the second surface, and
  capacitive elements each having a first electrode and a second electrode and each configured to cause a change in capacitance between the first electrode and the second electrode depending on a change in a distance between the first surface and the second surface facing each other via corresponding one of the spaces,
    the first electrode being arranged on one of the first surface and the second surface,
    the second electrode being arranged facing the first electrode; and
a controller having a detection part configured to detect the change in the capacitance and a signal generation part configured to generate an operation signal based on a detection result of the detection part.

(21) The input device according to (20), in which
the detection part is configured to determine, based on the change in the capacitance of the capacitive elements, a first state where an operation element is in contact with any of the plurality of sensors and a change from the first state to a second state where the operation element presses the sensor.

(22) The input device according to (20) or (21), in which
the plurality of sensors each further have a third surface arranged on a side opposite to the first surface with respect to the second surface and facing the second surface and have a reference electrode formed on the first surface,
the first electrodes are formed on the second surface, and
the second electrodes are formed on the third surface.

(23) The input device according to (22), in which
the first electrodes include aggregates of linear electrodes, and
the second electrodes include planar electrodes.

(24) The input device according to (23), in which
the linear electrodes each has a line width of equal to or smaller than 200 μm.

(25) The input device according to (20) to (24), in which
the first electrodes include a plurality of first wiring electrodes arranged in a first axis direction,
the second electrodes include a plurality of second wiring electrodes arranged in a second axis direction intersecting the first axis direction, and
the plurality of sensors each include a plurality of intersection parts where the first wiring electrodes and the second wiring electrodes intersect each other.

(26) The input device according to (25), in which
the plurality of intersection parts are formed with different density for each area.

(27) The input device according to (20) to (26), in which
the plurality of sensors include a plurality of sensors each having different sensitivity for detecting the capacitance of the capacitive element.

(28) An electronic apparatus, including:
a first surface and a second surface facing each other;
a support layer having first structures and spaces,
  the first structures each being partially arranged between the first surface and the second surface and each having a first height,
  the spaces each being formed between the first surface and the second surface;
capacitive elements each having a first electrode and a second electrode and each configured to cause a change in capacitance between the first electrode and the second electrode depending on a change in a distance between the first surface and the second surface facing each other via corresponding one of the spaces the first electrode being arranged on one of the first surface and the second surface, the second electrode being arranged facing the first electrode;

a controller having a detection part configured to detect the change in the capacitance and a signal generation part configured to generate an operation signal based on a detection result of the detection part; and an input operation part arranged on a side of the first surface of the capacitive elements.

(29) An electronic apparatus, including:

one or more sensors each having a first surface and a second surface facing each other, a support layer having first structures and spaces, the first structures each being partially arranged between the first surface and the second surface and each having a first height, the spaces each being formed between the first surface and the second surface, and capacitive elements each having a first electrode and a second electrode and each configured to cause a change in capacitance between the first electrode and the second electrode depending on a change in a distance between the first surface and the second surface facing each other via corresponding one of the spaces, the first electrode being arranged on one of the first surface and the second surface, the second electrode being arranged facing the first electrode;

a controller having a detection part configured to detect the change in the capacitance and a signal generation part configured to generate an operation signal based on a detection result of the detection part; and an input operation part arranged on a side of the first surface of the capacitive elements.

(30) The electronic apparatus according to (29), in which the sensors include a plurality of sensors, the first electrodes include a plurality of first wiring electrodes arranged in a first axis direction, the second electrodes include a plurality of second wiring electrodes arranged in a second axis direction intersecting the first axis direction, and the plurality of sensors each include one or more intersection parts where the first wiring electrodes and the second wiring electrodes intersect each other.

(31) The electronic apparatus according to (30), in which the plurality of first wiring electrodes and the plurality of second wiring electrodes each have an area arranged at a partially irregular pitch.

(32) The electronic apparatus according to (29) to (31), in which the input operation part is a flexible display configured to display an image based on the operation signal.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A sensor unit comprising:
a first substrate;
first and second electrodes;
an input portion disposed so that a gap exists between the substrate and the input portion;
a plurality of first structures disposed in the gap and extending at least partially between the first substrate and the input portion; and
a second insulating structure disposed on a side of the first structures that is away from the input portion and only between adjacent first structures;
wherein the sensor unit is configured to detect a change in capacitance between the first and second electrodes upon a change in position of the input portion relative to the first substrate.

2. The sensor unit according to claim 1, wherein the first structures are deformable.

3. The sensor unit according to claim 1, wherein the first electrodes intersect with the second electrodes to form a plurality of capacitive elements.

4. The sensor unit according to claim 1, further comprising a reference electrode spaced a distance apart from the first electrodes on a side of the input portion facing the gap.

5. The sensor unit according to claim 4, wherein the sensor unit is configured such that when the reference electrode is moved closer to the first substrate a capacitance between the first electrodes and the reference electrode increases, and the capacitance between the first electrodes and the second electrodes decreases.

6. The sensor unit according to claim 1, further comprising a second substrate, wherein the second electrodes are formed on the second substrate, the first substrate is formed on the second electrodes, and the first electrodes are formed on the first substrate.

7. The sensor unit according to claim 1, wherein the first electrodes are disposed between adjacent first structures.

8. The sensor unit according to claim 1, further comprising at least one regulation part disposed between adjacent first structures, and disposed between the first substrate and the input portion.

9. The sensor unit according to claim 1,
wherein the first structures are formed in a shape selected from the group consisting of a semispherical shape, a dome shape, a rectangular parallelepiped shape and a cylindrical shape.

10. The sensor unit according to claim 9, further comprising bonding portions formed in a second gap between tops of the first structures and a reference electrode formed on a side of the input portion facing the gap.

11. A method of detecting a change in capacitance in a sensor unit including a first substrate, first and second electrodes, an input portion disposed so that a gap exists between the substrate and the input portion, and a plurality of first structures disposed in the gap and extending at least partially between the first substrate and the input portion, and a second insulating structure disposed on a side of the first structures that is away from the input portion and only between adjacent first structures, the method comprising:
changing a position of the input portion relative to the first substrate; and
detecting a change in capacitance between the first and second electrodes based upon the change in position of the input portion relative to the first substrate.

12. The sensor unit according to claim 1, wherein the first electrodes are formed on the first substrate, and wherein the first substrate includes the second insulating structure.

13. The sensor unit according to claim 12, wherein the first structures are directly formed on the first electrodes.

14. The sensor unit according to claim 1, further comprising a frame body formed continuously or intermittently along a periphery of the second insulating structure.

15. The sensor unit according to claim 14,
wherein the second insulating structure is formed beneath the plurality of first structures, and
wherein the frame body and the second insulating structure and are integrally formed.

16. The sensor unit according to claim 1, wherein the first structures are made of a bonding material and extend across the gap to bond the first substrate to a reference electrode formed on a side of the input portion facing the gap.

17. The sensor unit according to claim 16, wherein the first structures are formed in a semispherical or dome shape.

18. The sensor unit according to claim 17, wherein the semispherical shape or the dome shape of the first structures protrude toward the first substrate side.

19. The sensor unit according to claim 17, wherein the semispherical shape or the dome shape of the first structures protrude toward the reference electrode side.

20. The sensor unit according to claim 16, wherein the first structures are formed in a in a rectangular parallelepiped shape or a cylindrical shape.

21. The sensor unit according to claim 1,
wherein the first electrodes intersect with the second electrodes to form a plurality of intersection areas, and
wherein the first structures are arranged in areas other than the intersection areas.

22. An electronic device comprising:
a sensor unit including
a first substrate,
first and second electrodes,
an input portion disposed so that a gap exists between the substrate and the input portion,
a plurality of first structures disposed in the gap and extending at least partially between the first substrate and the input portion, and
a second insulating structure disposed on a side of the first structures that is away from the input portion and only between adjacent first structures; and
a controller including
a detection part configured to detect a change in the capacitance between the first and second electrodes upon a change in position of the input portion relative to the first substrate, and
a signal generation part configured to generate an operation signal based on a detection result of the detection part.

23. A sensor unit comprising:
a first substrate;
a second substrate;
first and second electrodes;
an input portion disposed so that a gap exists between the substrate and the input portion;
a plurality of first structures disposed in the gap and extending at least partially between the first substrate and the input portion; and
a second insulating structure disposed on a side of the first structures that is away from the input portion, or between adjacent first structures;
wherein the sensor unit is configured to detect a change in capacitance between the first and second electrodes upon a change in position of the input portion relative to the first substrate, and wherein the second electrodes are formed on the second substrate, and wherein the second insulating structure is formed on the second electrodes.

24. The sensor unit according to claim 23, wherein the second insulating structure is a layer disposed between the first structures and the first substrate.

25. The sensor unit according to claim 24, wherein the first structures are formed directly on the second insulating structure.

\* \* \* \* \*